(12) United States Patent
Huang et al.

(10) Patent No.: US 12,353,075 B2
(45) Date of Patent: Jul. 8, 2025

(54) ELECTRONIC DEVICE

(71) Applicant: Innolux Corporation, Miaoli County (TW)

(72) Inventors: Yu-Chia Huang, Miaoli County (TW); Jui-Jen Yueh, Miaoli County (TW); Tsung-Han Tsai, Miaoli County (TW); Kuan-Feng Lee, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 18/480,517

(22) Filed: Oct. 4, 2023

(65) Prior Publication Data
US 2024/0027803 A1    Jan. 25, 2024

Related U.S. Application Data

(63) Continuation of application No. 17/990,753, filed on Nov. 21, 2022, now Pat. No. 11,867,990.

(30) Foreign Application Priority Data

Dec. 23, 2021 (CN) .......................... 202111592568.3

(51) Int. Cl.
*G02F 1/13* (2006.01)
*G02F 1/139* (2006.01)
*H10K 59/50* (2023.01)

(52) U.S. Cl.
CPC .......... *G02F 1/1323* (2013.01); *G02F 1/1393* (2013.01); *H10K 59/50* (2023.02)

(58) Field of Classification Search
CPC ...... G02F 1/1323; G02F 1/1393; H10K 59/50
See application file for complete search history.

(56) References Cited

U.S. PATENT DOCUMENTS

2021/0074779 A1 *  3/2021  Park .................... H10K 59/126

* cited by examiner

*Primary Examiner* — James A Dudek
(74) *Attorney, Agent, or Firm* — JCIPRNET

(57) ABSTRACT

An electronic device including a panel and a light control unit is provided. The panel includes a first light-emitting region and a transparent region disposed adjacent to the first light-emitting region. The light control unit is disposed on the panel, wherein the light control unit is overlapped with the first light-emitting region.

12 Claims, 21 Drawing Sheets

ELECTRONIC DEVICE

CROSS-REFERENCE TO RELATED APPLICATION

This application is a continuation application of and claims the priority benefit of U.S. application Ser. No. 17/990,753, filed on Nov. 21, 2022, which claims the priority benefit of China application Ser. No. 202111592568.3, filed on Dec. 23, 2021. The entirety of each of the above-mentioned patent applications is hereby incorporated by reference herein and made a part of this specification.

BACKGROUND

Technical Field

The disclosure relates to an electronic device, and particularly relates to an electronic device including a light control unit.

Description of Related Art

In electronic devices, light beams emitted by a display panel have various angles. The light beams of some angles may affect quality of an image viewed by a viewer. For example, in a vehicle display device, a large-angle light beam (for example, an upward light beam) output by the display panel may be reflected by a windshield to produce stray light, which is then transmitted to the driver's eyes, and such stray light may affect driver's attention. Therefore, to adjust the angle of the light beam emitted by the display panel to improve the image quality is one of the problems that current R&D personnel urgently want to solve.

SUMMARY

The disclosure is directed to an electronic device, which is adapted to adjust an angle of a light beam emitted by a panel to improve image quality.

An embodiment of the disclosure provides an electronic device including a panel and a light control unit. The panel includes a first light-emitting region and a transparent region disposed adjacent to the first light-emitting region. The light control unit is disposed on the panel, where the light control unit is overlapped with the first light-emitting region.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
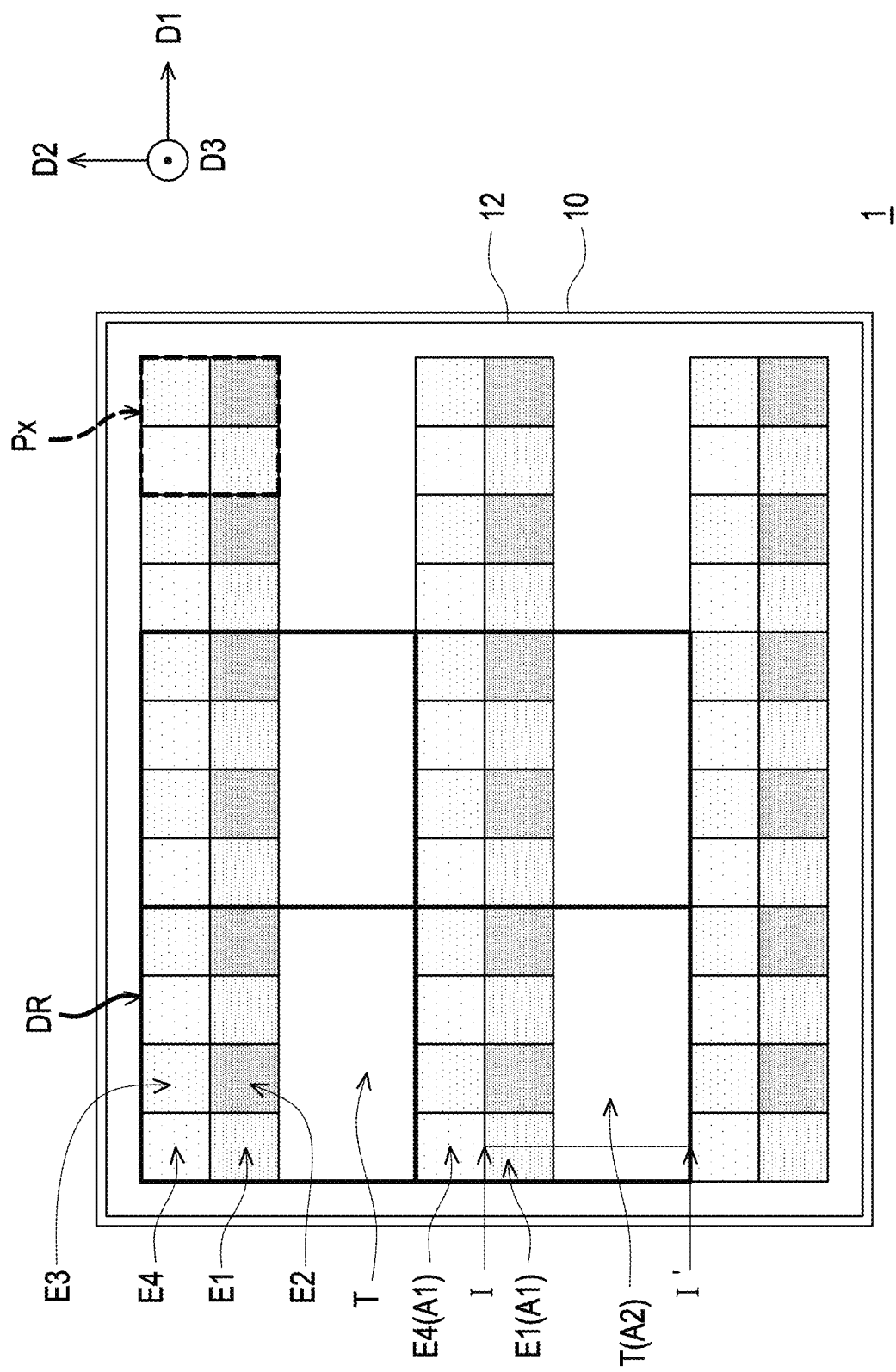
FIG. 1A and FIG. 1B are respectively a schematic partial top view and a schematic partial cross-sectional view of an electronic device according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Throughout the specification and claims of the disclosure, certain words are used to refer to specific elements. Those skilled in the art should understand that electronic device manufacturers may refer to the same elements by different names. This specification does not intend to distinguish those elements with the same function but different names. In the following description and claims, the words "have" and "include" are open-ended words, so they should be interpreted as "including but not limited to . . . ".

Directional terminology used in the specification, such as "top," "bottom," "front," "back," "left," "right," etc., are used with reference to the orientation of the Figure(s) being described. Therefore, the used directional terms are used to illustrate, not to limit the disclosure. In the drawings, each drawing shows the general features of the methods, structures, and/or materials used in a specific embodiment. However, these drawings should not be construed as defining or limiting the scope or nature covered by these embodiments. For example, for clarity's sake, relative size, thickness and position of each film layer, region and/or structure may be reduced or enlarged.

One structure (or layer, element, substrate) described in the disclosure is located on/above another structure (or layer, element, substrate), which means that the two structures are adjacent and in direct connection, or means that the two structures are adjacent but in indirect connection. Indirect connection means that there is at least one intermediate structure (or intermediate layer, intermediate element, intermediate substrate, intermediate space) between the two structures, a lower surface of a structure is adjacent or directly connected to an upper surface of the intermediate structure, and an upper surface of the other structure is adjacent to or directly connected to a lower surface of the intermediate structure. The intermediary structure may be composed of a single-layer or multi-layer physical structure or non-physical structure, which is not limited by the disclosure. In the disclosure, when a certain structure is described to be "on" another structure, it means that the certain structure is "directly" on the another structure, or means that the certain structure is "indirectly" on the another structure, i.e., at least one structure is further clamped between the certain structure and the another structure.

The terms "about", "equal to", "equal" or "same", "substantially" or "approximately" are generally interpreted as being within 20% of a given value or range, or interpreted as being within 10%, 5%, 3%, 2%, 1%, or 0.5% of the given value or range.

The ordinal numbers used in the specification and claims, such as "first", "second", etc., are used to modify components, and do not imply and represent that the component or these components have any previous ordinal numbers, and do not represent a sequence of one component with another, or a sequence in a manufacturing method. The use of these ordinal numbers is only to make a clear distinction between one component with a certain name and another component with the same name. The same terms may not be used in the claims and the specification, and accordingly, a first component in the specification may be a second component in the claims.

The electrical connection or coupling described in this disclosure may refer to direct connection or indirect connection. In the case of direct connection, terminals of components on two circuits are directly connected or connected to each other by a conductor line segment, and in the case of indirect connection, there are switches, diodes, capacitors, inductors, resistors, other suitable components, or a combination of the above components between the terminals of the components on the two circuits, but the disclosure is not limited thereto.

In the disclosure, a thickness, length, width, and area may be measured by using an optical microscope, and the thickness may be obtained by measuring a cross-sectional image in the electron microscope, but the disclosure is not limited thereto. In addition, there may be a certain error in any two values or directions used for comparison. In addition, the terms "equal to", "equal", "same", "substantially" or "approximately" mentioned in the present disclosure usually represent within 10% of a given value or range. Moreover, the expressions "the given range is a first value to a second value", "the given range falls within a range of the first value to the second value" mean that the given range includes the first value, the second value, and other values there between. If a first direction is perpendicular to a second direction, an angle between the first direction and the second direction may be between 80 degrees and 100 degrees; and if the first direction is parallel to the second direction, the angle between the first direction and the second direction may be between 0 degree and 10 degrees.

It should be noted that in the following embodiments, features in a plurality of different embodiments may be substituted, reorganized, and mixed to complete other embodiments without departing from the spirit of the present disclosure. The features of the various embodiments may be mixed and matched arbitrarily as long as they do not violate or conflict with the spirit of the disclosure.

Unless otherwise defined, all terms (including technical and scientific terms) used herein have the same meanings as commonly understood by those skilled in the art to which this disclosure belongs. It is understandable that these terms, such as those defined in commonly used dictionaries, should be interpreted as having meaning consistent with the relevant technology and the background or context of this disclosure, and should not be interpreted in an idealized or excessively formal way, unless there is a special definition in the embodiment of the disclosure.

In the disclosure, the electronic device may include a display device, a backlight device, an antenna device, a sensing device, or a splicing device, but the disclosure is not limited thereto. The electronic device may be a bendable or flexible electronic device. The display device may be a non-self-luminous type display device or a self-luminous type display device. The antenna device may be a liquid crystal type antenna device or a non-liquid crystal type antenna device, and the sensing device may be a sensing device that senses capacitance, light, heat, or ultrasound, but the disclosure is not limited thereto. In the disclosure, the electronic device may include electronic components, and the electronic components may include passive components and active components, such as capacitors, resistors, inductors, diodes, transistors, etc. The diode may include a light-emitting diode or a photodiode. The light-emitting diode may include, for example, an organic light-emitting diode (OLED), a mini LED, a micro LED or a quantum dot LED, but the disclosure is not limited thereto. The splicing device may be, for example, a display splicing device or an antenna splicing device, but the disclosure is not limited thereto. It should be noted that the electronic device may be any arrangement and combination of the foregoing, but the disclosure is not limited thereto. In the following descriptions, a display device is used as an electronic device or a splicing device to describe the content of the disclosure, but the disclosure is not limited thereto.

It should be noted that the technical solutions provided by the different embodiments below may be replaced, combined or mixed with each other to form another embodiment without violating the spirit of the disclosure.

Figure 1B:
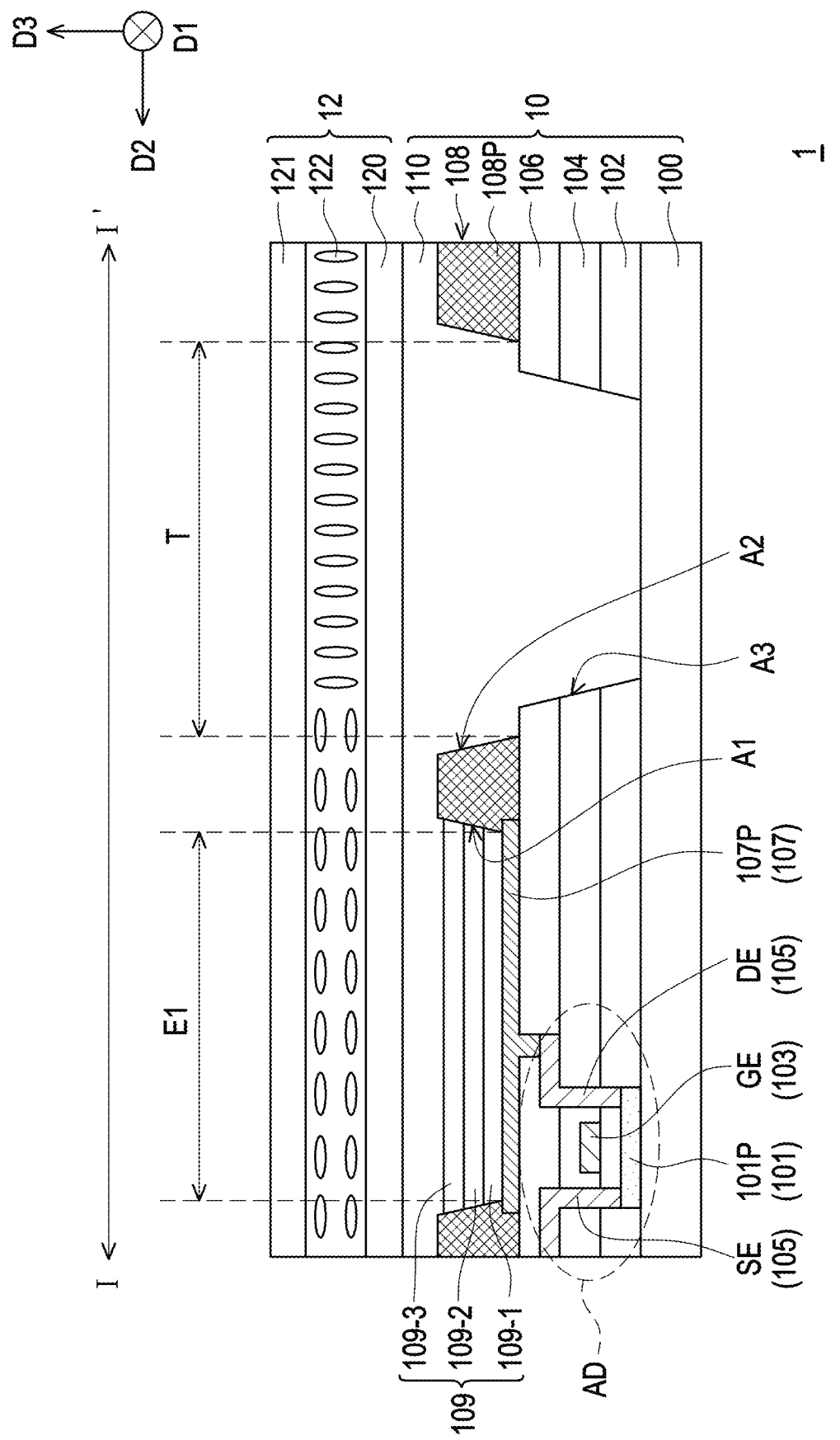

FIG. 1A and FIG. 1B are respectively a schematic partial top view and a schematic partial cross-sectional view of an electronic device according to an embodiment of the disclosure. FIG. 1B is, for example, a cross-section corresponding to a section line I-I' in FIG. 1A.

Referring to FIG. 1A and FIG. 1B, the electronic device 1 may include a panel 10 and a light control unit 12. The panel 10 may include a first light-emitting region E1 and a transparent region T disposed adjacent to the first light-emitting region E1. The light control unit 12 is disposed on the panel 10, wherein the light control unit 12 is overlapped with the first light-emitting region E1.

The panel 10 may be used to provide display information, such as patterns, or text, etc., but the disclosure is not limited thereto. The panel 10 may be a display panel. The panel 10 may be a transparent display panel or a non-transparent display panel. The panel 10 may be a self-luminous display panel or a non-self-luminous display panel. When the panel 10 is a non-self-luminous display panel, the electronic device 1 may further include a light source module.

Taking an organic LED display panel as an example, as shown in FIG. 1B, the panel 10 may include a substrate 100, a semiconductor layer 101, an insulating layer 102, a first conductive layer 103, an insulating layer 104, a second conductive layer 105, an insulating layer 106, a third conductive layer 107, a pixel definition layer 108, a light-emitting element 109 and a filling layer 110, but the disclosure is not limited thereto.

The substrate 100 may be used to carry components or film layers. For example, the substrate 100 may be a rigid substrate or a flexible substrate. A material of the rigid substrate 100 may include glass, ceramic, quartz, sapphire, or a combination of the above materials, but the disclosure is not limited thereto. The flexible substrate may be, for example, resin, polyethylene naphthalate (PEN), polyether sulfone (PES), polyethylene terephthalate (PET), polycarbonate (PC), poly(methyl methacrylate) (PMMA), polyimide (PI), or a combination thereof, but the disclosure is not limited thereto.

The semiconductor layer 101 is disposed on the substrate 100. For example, a material of the semiconductor layer 101 may include amorphous silicon, polysilicon or oxide semiconductor, but the disclosure is not limited thereto. The semiconductor layer 101 may be a patterned semiconductor layer and may include a plurality of semiconductor patterns 101P separated from each other (only one is shown in FIG. 1B).

The insulating layer 102 is disposed on the substrate 100 and covers the semiconductor layer 101. For example, a material of the insulating layer 102 may include an inorganic material or an organic material, where the inorganic material includes, for example, silicon oxide or silicon nitride, but the disclosure is not limited thereto.

The first conductive layer 103 is disposed on the insulating layer 102. For example, a material of the first conductive layer 103 may include metal or metal lamination layers, such as aluminum, molybdenum, copper, or titanium/aluminum/titanium, etc., but the disclosure is not limited thereto. The first conductive layer 103 may be patterned and may include a plurality of gate electrodes GE (only one is shown in FIG. 1B), a plurality of signal lines (not shown), etc., but the disclosure is not limited thereto. The plurality of gate electrodes GE are respectively disposed above the plurality of semiconductor patterns 101P.

The insulating layer 104 is disposed on the insulating layer 102 and covers the first conductive layer 103. For example, a material of the insulating layer 104 may refer to the material of the insulating layer 102, and detail thereof is not repeated.

The second conductive layer 105 is provided on the insulating layer 104. For example, a material of the second conductive layer 105 may refer to the material of the first conductive layer 103, and detail thereof is not repeated. The second conductive layer 105 may be patterned and may include a plurality of source electrodes SE (only one is shown in FIG. 1B), a plurality of drain electrodes DE (only one is shown in FIG. 1B), a plurality of signal lines (not shown), etc., but the disclosure is not limited thereto. In an embodiment, the source electrode SE may penetrate through the insulating layer 102 and the insulating layer 104 and may be connected to a partial region (such as a source region) of the semiconductor pattern 101P. The drain electrode DE may penetrate through the insulating layer 102 and the insulating layer 104 and may be connected to another partial region (such as a drain region) of the semiconductor pattern 101P.

In the electronic device 1, each gate electrode GE, a corresponding semiconductor pattern 101P, a corresponding source SE, and a corresponding drain DE constitute an active device AD, and the electronic device 1 may include a plurality of active devices AD (only one is shown in FIG. 1B).

The insulating layer 106 is disposed on the insulating layer 104 and covers the second conductive layer 105. For example, a material of the insulating layer 106 may refer to the material of the insulating layer 102, and detail thereof is not repeated.

The third conductive layer 107 is disposed on the insulating layer 106. For example, a material of the third conductive layer 107 may refer to the material of the first conductive layer 103, and detail thereof is not repeated. The third conductive layer 107 may be patterned and may include a plurality of electrode patterns 107P (only one is shown in FIG. 1B), but the disclosure is not limited thereto. In an embodiment, the electrode pattern 107P may penetrate through the insulating layer 106 and may be connected to the drain electrode DE.

The pixel definition layer 108 is disposed on the insulating layer 106 to define a configuration position of the light-emitting element 109. For example, a material of the pixel definition layer 108 may include an opaque or translucent polymer material, such as a black resin or a translucent resin material, but the disclosure is not limited thereto. FIG. 1B is a cross-section corresponding to a section line I-I' in FIG. 1A. As shown in FIG. 1B, the pixel definition layer 108 may be patterned to form a plurality of openings and a plurality of pixel definition patterns 108P. The plurality of openings may include a plurality of first openings A1 and a plurality of second openings A2. The first opening A1 of the pixel definition layer 108 may define a light-emitting region (for example, the first light-emitting region E1), for example, the configuration position of the light-emitting element 109. The second opening A2 of the pixel definition layer 108 may define a transparent region T. FIG. 1B only shows two openings: the first opening A1 and the second opening A2. To make the drawing concise and easy to explain, the pixel definition layer 108 is not shown in FIG. 1A.

According to some embodiments, the thickness of the insulating layer under the first opening A1 may be greater than the thickness of the insulating layer under the second opening A2. According to some embodiments, the number of the insulating layers under the first opening A1 may be greater than the number of the insulating layers under the second opening A2. To be specific, as shown in FIG. 1B, the insulating layer 102, the insulating layer 104, and the insulating layer 106 are disposed on the substrate 100 under the first opening A1. Corresponding to the position of the second opening A2 (under the second opening A2), the insulating layer has an opening A3. For example, the insulating layer 102, the insulating layer 104, and the insulating layer 106 form the opening A3 at a position corresponding to the second opening A2. The opening A3 of the insulating layer may be overlapped with the second opening A2 of the pixel definition layer 108 to define the transparent region T. FIG. 1B shows that in the transparent region T, three insulating layers (the insulating layer 102, the insulating layer 104, and the insulating layer 106) form the opening A3 to expose the substrate 100. However, according to other embodiments, in the transparent region T, the opening A3 does not need to expose the substrate 100, i.e., at the position of the opening A3, there is still an insulating layer (not shown) disposed on the substrate 100. For example, at the corresponding position of the opening A3, at least one of the insulating layer 102, the insulating layer 104, and the insulating layer 106 may be retained.

The light-emitting element 109 may be disposed in the first opening A1. Taking an organic LED as an example, the light-emitting element 109 may include a hole transport layer 109-1, a light-emitting layer 109-2, and an electron transport layer 109-3 sequentially stacked on the insulating layer 106, but the disclosure is not limited thereto. In some embodiments, although not shown, an electrode pattern may be further configured on the electron transport layer 109-3.

The filling layer 110 is disposed on the pixel definition layer 108 and covers the light-emitting element 109. For example, a material of the filling layer 110 may include an organic material or a polymer material, such as PMMA, epoxy, acrylic-based resin, silicone, polyimide polymer or a combination of the above materials, but the disclosure is not limited thereto. The filling layer 110 may have a single-layer or multi-layer structure.

It should be understood that the components or film layers in the panel 10 may be increased or decreased according to different requirements. For example, when the panel 10 is a micro LED display panel, the panel 10 may optionally omit the pixel definition layer 108, but the disclosure is not limited thereto.

FIG. 1B is a cross-section corresponding to the section line I-I' in FIG. 1A. As shown in FIG. 1B, in the panel 10, under the structure configured with the pixel definition layer 108, a bottom range of the first opening A1 of the pixel definition layer 108 may be taken as a range of the light-emitting region (such as the first light-emitting region E1). To make the drawing concise and easy to explain, the pixel definition layer 108 is not shown in FIG. 1A. On the other hand, according to some embodiments, under the structure without the pixel definition layer 108, a light-emitting surface of the light-emitting element 109 (such as a micro LED) may be taken as the range of the light-emitting region (such as the first light-emitting region E1).

In some embodiments, as shown in FIG. 1A, the panel 10 may further include a second light-emitting region E2, a third light-emitting region E3, and a fourth light-emitting region E4, but the disclosure is not limited thereto. Similar to the aforementioned description, the first opening A1 of the pixel definition layer 108 may define the first light-emitting region E1, the second light-emitting region E2, the third light-emitting region E3, and the fourth light-emitting region E4. The second light-emitting region E2 is located adjacent to the first light-emitting region E1 in a first direction D1, the third light-emitting region E3 is located adjacent to the second light-emitting region E2 in a second direction D2, and the fourth light-emitting region E4 is located adjacent to the first light-emitting region E1 in the second direction D2. The first direction D1 and the second direction D2 may be different, and may be intersected with each other. The first direction D1 and the second direction D2 may both be perpendicular to a normal direction (such as a third direction D3) of the substrate 100. For example, the first direction D1 and the second direction D2 may be perpendicular to each other, but the disclosure is not limited thereto.

Although the pixel definition layer 108 is not shown in FIG. 1A, regarding an electronic device with the pixel definition layer, each light-emitting region may be defined by the first opening A1 of the pixel definition layer 108, and the transparent region T may be defined by the second opening A2 of the pixel definition layer 108. To be specific, for example, referring to the fourth light-emitting region E4 (A1), the first light-emitting region E1 (A1), and the transparent region T (A2) indicated along the second direction D2, the two first openings A1 of the pixel definition layer 108 may define the fourth light-emitting region E4 and the first light-emitting region E1, and the fourth light-emitting region E4 (A1) and the first light-emitting region E1 (A1) are separated by the pixel definition pattern 108P. The second opening A2 of the pixel definition layer 108 may define the transparent region T, and the first light-emitting region E1 (A1) and the transparent region T (A2) are separated by the pixel definition pattern 108P.

As shown in FIG. 1A, in an embodiment, the first light-emitting region E1, the second light-emitting region E2, the third light-emitting region E3, and the fourth light-emitting region E4 are, for example, a red light-emitting region, a green light-emitting region, a blue light-emitting region, and a white light-emitting region, respectively, but the disclosure is not limited thereto. The colors of the first light-emitting region E1, the second light-emitting region E2, the third light-emitting region E3, and the fourth light-emitting region E4 are only an example, and the disclosure is not limited thereto. The above-mentioned arrangement sequence of the first light-emitting region E1, the second light-emitting region E2, the third light-emitting region E3, and the fourth light-emitting region E4 is only an example, and the disclosure is not limited thereto. According to some embodiments, one light-emitting region (for example, one first light-emitting region E1) may define one sub-pixel. According to some embodiments, a plurality of light-emitting regions (sub-pixels) of different colors may constitute one pixel. For example, the first light-emitting region E1, the second light-emitting region E2, and the third light-emitting region E3 may define one pixel. For example, the first light-emitting region E1, the second light-emitting region E2, the third light-emitting region E3, and the fourth light-emitting region E4 may define a pixel Px, as shown by a dashed frame in FIG. 1A.

In some embodiments, the panel 10 may include a plurality of first light-emitting regions E1, a plurality of second light-emitting regions E2, a plurality of third light-emitting regions E3, and a plurality of fourth light-emitting regions E4. The plurality of first light-emitting regions E1 and the plurality of second light-emitting regions E2 are, for example, alternately arranged in the first direction D1. The plurality of third light-emitting regions E3 and the plurality of fourth light-emitting regions E4 are, for example, alternately arranged in the first direction D1. The plurality of first light-emitting regions E1, the plurality of fourth light-emitting regions E4, and the transparent regions T are, for example, alternately arranged in the second direction D2. The plurality of second light-emitting regions E2, the plurality of third light-emitting regions E3, and the transparent regions T are, for example, alternately arranged in the second direction D2. However, it should be understood that the color types, the number of colors, or arrangement method of the light-emitting regions in the panel 10 may be changed according to different requirements, which is not limited to that shown in FIG. 1A.

The transparent region T is arranged on one side of the first light-emitting region E1. For example, in the second direction D2, the transparent region T is located between the first light-emitting region E1 and the fourth light-emitting region E4, and there is no other light-emitting region (such as the second light-emitting region E2, the third light-emitting region E3 or the fourth light-emitting region E4) between the transparent region T and the first light-emitting region E1.

Figure 2:
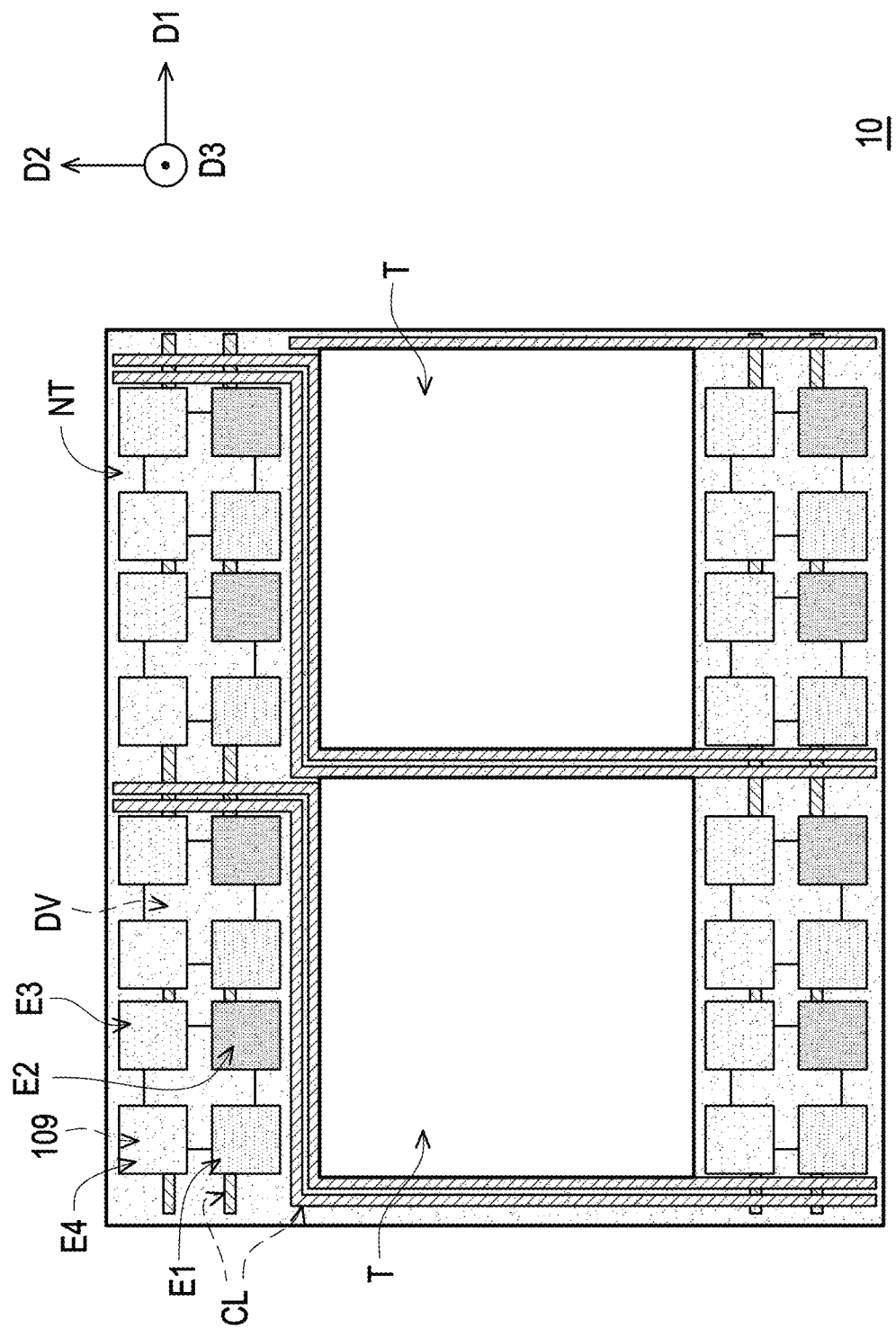
FIG. 2 is a schematic partial top view of a panel in an electronic device according to an embodiment of the disclosure.

As shown in FIG. 1A, the panel 10 may include a plurality of light-emitting regions and a plurality of transparent regions T. Several light-emitting regions and one transparent region T may form a display block DR. For example, in FIG. 1A, one display block DR may include 8 light-emitting regions and one transparent region T, for example, 2 pixels Px and one transparent region T. The panel 10 may include a plurality of repeated display blocks DR. As shown in FIG. 2, the display block DR may include 8 light-emitting regions and one transparent region T. The numbers of the light-emitting regions and the transparent region in the display block DR are only an example, and the disclosure is not limited thereto. As described above, the transparent region T is defined by the second opening A2 of the pixel definition layer 108, and, as shown in FIG. 1B, the second opening A2 is defined by the pixel definition pattern 108P. Therefore, as shown in FIG. 1A, two adjacent transparent regions T (for example, two transparent regions T along the first direction D1) may be separated by the pixel definition pattern 108P. Two adjacent transparent regions T means that there are no other light-emitting regions between the two adjacent transparent regions T. Furthermore, as shown in FIG. 1A, two adjacent display blocks DR (for example, two adjacent display blocks DR along the first direction D1) may be separated by the pixel definition pattern 108P. According to some embodiments, the pixel definition pattern 108P may not be provided in the transparent region T in the same display block DR.

The transparent region T may be observed by using an optical microscope. FIG. 2 is a schematic partial top view of a panel in an electronic device according to an embodiment of the disclosure. Referring to FIG. 2, the panel 10 includes a plurality of opaque elements, such as a driving circuit DV, a light-emitting element 109, conductive lines CL (such as a signal line, a power line, etc.), a black matrix (not shown), and a black pixel definition layer 108 (not shown in FIG. 2, referring to FIG. 1B), metal pads (not shown), etc. The aforementioned opaque elements are arranged in an opaque region NT and located outside the transparent region T, i.e., the transparent region T does not include the aforementioned opaque elements. A range of the transparent region T may be defined by a range of the opaque region NT. In detail, as shown in FIG. 2, a boundary of the transparent region T may be defined by the opaque elements in the opaque region NT. For example, edges of the conductive lines CL and/or the light-emitting region may define the boundary of the transparent region T. For example, the boundary of the transparent region T may be defined by a side of the opaque element facing the transparent region T and located at the edge of the opaque region NT. In some embodiments, the range of the transparent region T may be further defined by a light transmittance or an area ratio of the transparent region to the light-emitting region. For example, a light transmittance of the transparent region T to visible light (such as light with a wavelength of 400 nm to 700 nm or light with a wavelength of 550 nm) may be greater than or equal to 60% and less than or equal to 99%; or, the light transmittance may be greater than or equal to 60% and less than or equal to 80%. In some other embodiments, one display block DR includes several light-emitting regions and one transparent region T. An area ratio of the transparent region T to one light-emitting region (such as the first light-emitting region E1, the second light-emitting region T, the third light-emitting region E3 or the fourth light-emitting region E4) in one display block DR may be greater than or equal to 1 and less than or equal to 20; or, the area ratio may be greater than or equal to 2 and less than or equal to 8. It should be understood that, for the ease of drawing and description, FIG. 1A omits illustrating the above-mentioned opaque elements. In addition, the boundaries of the plurality of light-emitting regions and the boundaries between the light-emitting regions and the transparent region T in FIG. 1A may be provided with the pixel definition pattern 108P.

Referring to FIG. 1A and FIG. 1B again, the light control unit 12 is used to adjust a viewing angle of the electronic device 1. In some embodiments, the light control unit 12 is electrically switchable, i.e., the light control unit 12 may be controlled by changing a voltage to adjust the viewing angle of the electronic device 1. For example, the light control unit 12 may include a photoelectric material, such as liquid crystal, polymer dispersed liquid crystal (PDLC), dye-doped liquid crystal (DDLC), an electrochromic material or liquid lens, etc., but the disclosure is not limited thereto. When the light control unit 12 includes liquid crystal, such as electrically controlled birefringence (ECB) liquid crystal, a phase of the light passing through the light control unit 12 may be changed through voltage control to adjust the viewing angle of the electronic device 1. When the light control unit 12 includes polymer dispersed liquid crystal, a haze of the light control unit 12 may be changed through voltage control to adjust the viewing angle of the electronic device 1. When the light control unit 12 includes dye-doped liquid crystal, a color of the light control unit 12 may be changed through voltage control to adjust the viewing angle of the electronic device 1. When the light control unit 12 includes an electrochromic material, the color of the light control unit 12 may be changed through voltage control to adjust the viewing angle of the electronic device 1. When the light control unit 12 includes a liquid lens, a block liquid appearance may be changed through voltage control, so as to change a light path to adjust the viewing angle of the electronic device 1.

Taking the light control unit 12 including liquid crystal as an example, as shown in FIG. 1B, the light control unit 12 may include a substrate 120, a substrate 121, and liquid crystal 122. The substrate 121 is opposite to the substrate 120, and the liquid crystal 122 is disposed between the substrate 121 and the substrate 120. A material of the substrate 121 and the substrate 120 may refer to the material of the substrate 100, which will not be repeated. In some embodiments, although not shown, one side (such as a lower side) or the opposite sides (such as upper and lower sides) of the liquid crystal 122 may be provided with a conductive layer. A tilting direction of the liquid crystal is changed by controlling a voltage of the conductive layer, so as to adjust the viewing angle of the electronic device 1.

In some embodiments, in addition to being overlapped with the first light-emitting region E1, the light control unit 12 may also be overlapped with the second light-emitting region E2, the third light-emitting region E3, the fourth light-emitting region E4, and the transparent region T. Namely, the light control unit 12 is overlapped with the first light-emitting region E1, the second light-emitting region E2, the third light-emitting region E3, the fourth light-emitting region E4, and the transparent region T in the third direction D3. FIG. 1A schematically shows that an area of the light control unit 12 is slightly smaller than an area of the panel 10, but the disclosure is not limited thereto. In other embodiments, the area of the light control unit 12 may be greater than, equal to, or smaller than the area of the panel 10.

Under the structure that the light control unit 12 adopts a photoelectric material, the light control unit 12 overlapped with the light-emitting regions (such as the first light-emitting region E1, the second light-emitting region E2, the third light-emitting region E3 and the fourth light-emitting region E4) in the third direction D3 may be activated, and the light control unit 12 not overlapped with the light-emitting regions in the third direction D3 is not activated, so as to change the viewing angle of the electronic device 1 at the light-emitting region without changing the viewing angle of the electronic device 1 at a region other than the light-emitting region (such as the transparent region T). In other embodiments, although not shown, the light control unit 12 may be activated as a whole to change the overall viewing angle of the electronic device 1.

According to some embodiments, the light control unit may suppress the light of a specific direction that is emitted from the panel, which may improve the quality of an image viewed by the viewer. According to some embodiments, the electronic device may be used in a vehicle, and the light control unit may suppress the light of a specific direction that is emitted from the panel. In this way, the light in the specific direction may be reduced from being reflected by a windshield, so as to reduce stray light viewed by the driver, and improve the quality of the image viewed by the driver, and mitigate the impact on the driver's attention.

Figure 3A:
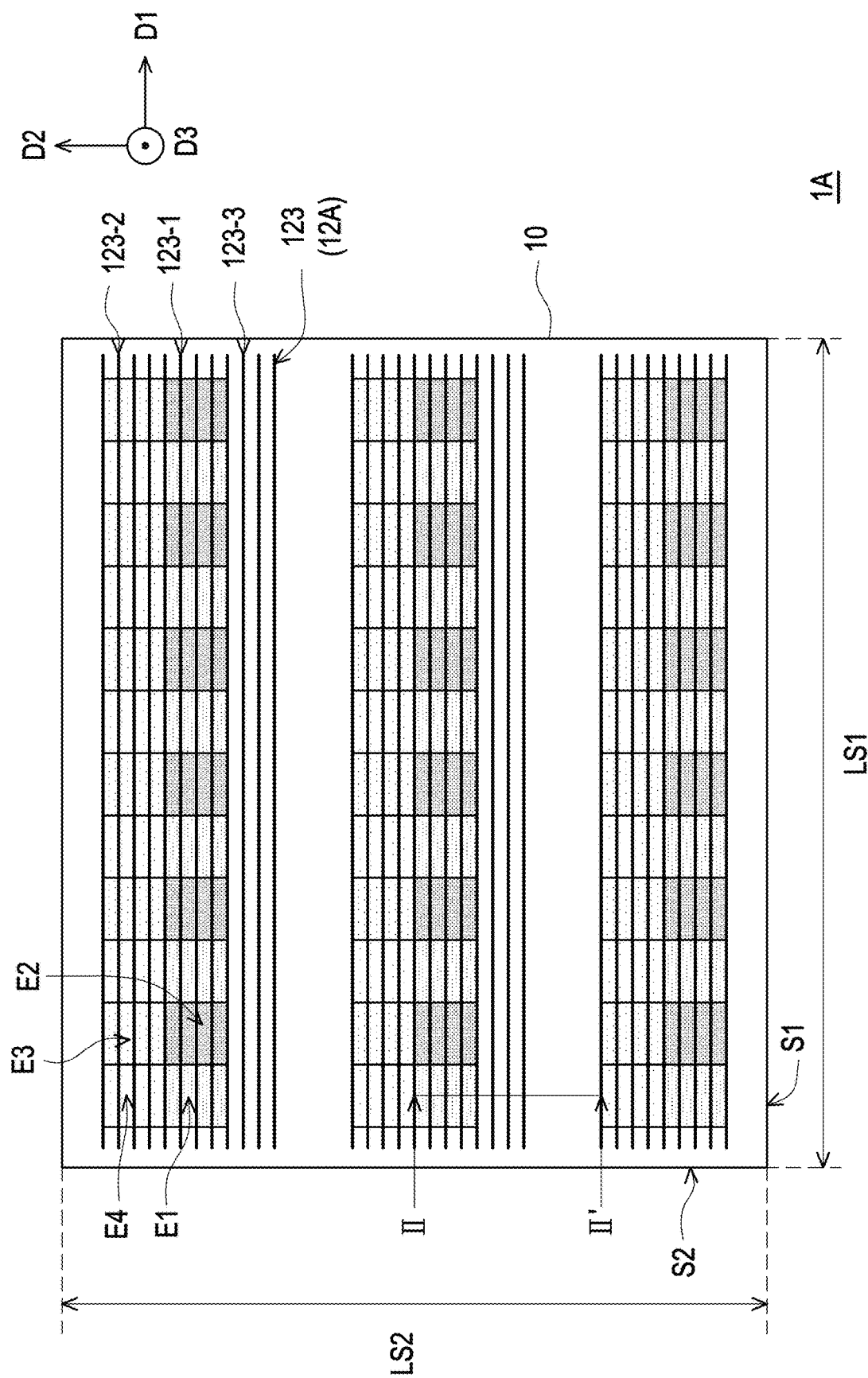
FIG. 3A and FIG. 3B are respectively a schematic partial top view and a schematic partial cross-sectional view of an electronic device according to another embodiment of the disclosure.
Figure 3B:
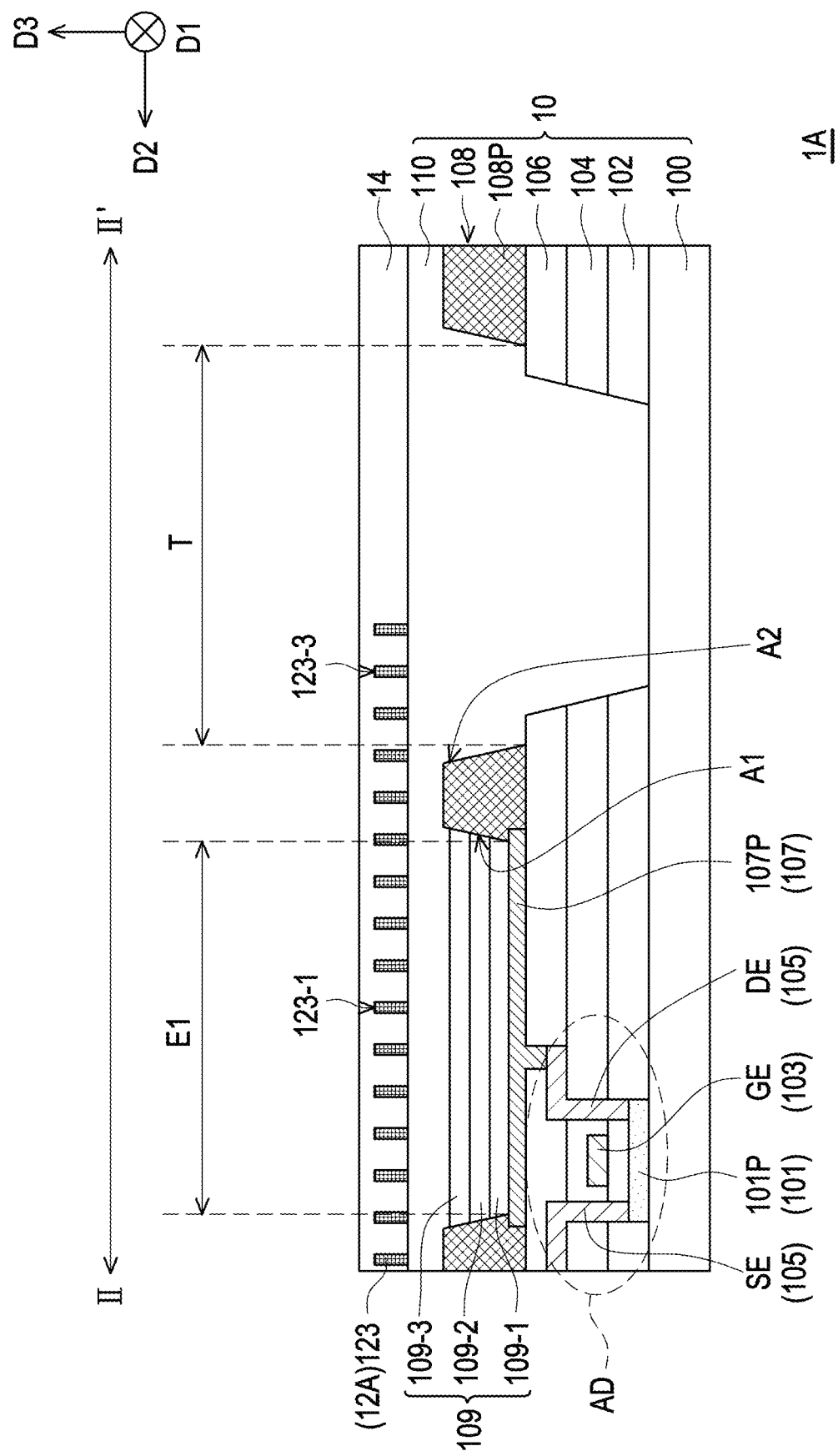

FIG. 3A and FIG. 3B are respectively a schematic partial top view and a schematic partial cross-sectional view of an electronic device according to another embodiment of the disclosure. FIG. 3B is, for example, a cross-section corresponding to a section line II-II' in FIG. 3A.

Referring to FIG. 3A and FIG. 3B, main differences between an electronic device 1A and the electronic device 1 of FIGS. 1A and 1B are described as follows.

For the convenience of description, some top views of the following embodiments do not show the range of the display block DR. However, it may be understood that the panel 10 may include a plurality of the above-mentioned display blocks DR. As shown in FIG. 3A, in the electronic device 1A, the panel 10 includes the first light-emitting region E1 and the second light-emitting region E2. The second light-emitting region E2 is disposed adjacent to the first light-emitting region E1 in the first direction D1, and a light control unit 12A extends along the first direction D1 and is overlapped with the second light-emitting region E2. The range of one display block DR is not shown in FIG. 3A. For example, the light control unit 12A may include a plurality of light-shielding elements 123, the plurality of light-shielding elements 123 extend along the first direction D1, and at least one light-shielding element (such as a light-shielding element 123-1) of the plurality of light-shielding elements 123 is overlapped with the first light-emitting region E1 and the second light-emitting region E2 arranged in the first direction D1. In some embodiments, as shown in FIG. 3A, at least another light-shielding element (such as a light-shielding element 123-2) of the plurality of light-shielding elements 123 may be overlapped with the third light-emitting region E3 and the fourth light-emitting region E4 arranged in the first direction D1, and at least one another light-shielding element (such as a light-shielding element 123-3) of the plurality of light-shielding elements 123 may be overlapped with the transparent region T extending in the first direction D1, but the disclosure is not limited thereto.

In some embodiments, as shown in FIG. 3B, in addition to being overlapped with the light-emitting region (such as the first light-emitting region E1), the light control unit 12A may also be partially overlapped with the transparent region T, for example, the light-shielding element 123-1 in the light control unit 12A is overlapped with the first light-emitting region E1, and the light-shielding element 123-3 in the light control unit 12A is overlapped with the transparent region T, but the disclosure is not limited thereto. In other embodiments, although not shown, the light control unit 12A may not be overlapped with the transparent region T. For example, the light-shielding element 123-3 may be omitted in FIG. 3, and when a viewer views a scene behind the electronic device 1A through the transparent region T, the display quality (such as image clarity) of the scene viewed by the viewer in the transparent area T may be improved, but the disclosure is not limited thereto. In still some other embodiments, although not shown, the light control unit 12A may be overlapped with the entire display region (not shown) of the panel 10. In detail, the panel 10 may include a display region, which may include the above-mentioned light-emitting regions (for example, the first light-emitting region E1, the second light-emitting region E2, the third light-emitting region E3, and the fourth light-emitting region E4) and the transparent region T. For example, the plurality of light-shielding elements 123 may be arranged on the light-emitting regions and the transparent region T, thereby improving process convenience.

In some embodiments, as shown in FIG. 3B, the plurality of light-shielding elements 123 may be disposed on the filling layer 110. A material of the plurality of light-shielding elements 123 may include black resin, gray resin, white resin or metal, but the disclosure is not limited thereto. In some embodiments, the electronic device 1A may further include a cover layer 14. The cover layer 14 is disposed on the filling layer 110 and includes the plurality of light-shielding elements 123. Namely, the plurality of light-shielding elements 123 may be configured in the cover layer 14. For example, a material of the cover layer 14 may include an organic material or a polymer material, such as PMMA, epoxy resin, acrylic-based resin, silicone, polyimide polymer, or a combination of the above materials, but the disclosure is not limited thereto.

As shown in FIG. 3A, through the arrangement of the plurality of light-shielding elements 123 extending in the first direction D1 and arranged in the second direction D2, a light divergence angle of the electronic device 1A in the second direction D2 may be limited, i.e., the viewing angle of the electronic device 1A in the second direction D2 is limited. According to some embodiments, the electronic device may be applied to a vehicle, and the light control unit may suppress light (upward light) emitted by the panel in a specific direction (for example, the second direction D2). In this way, since the light in the specific direction (such as the second direction D2) is suppressed, the light in the specific direction may be reduced from being reflected by the windshield, so as to reduce the stray light viewed by the driver, which helps to mitigate the problem of the stray light, and may also improve the quality of the image viewed by the driver to mitigate the impact on the driver's attention.

In FIGS. 3A and 3B, the electronic device 1A has a first side S1 and a second side S2 connected to the first side S1, where a length LS1 of the first side S1 is greater than a length LS2 of the second side S2, and the first side S1 is substantially parallel to the extending direction of the light control unit 12A (i.e., the extending direction of the light-shielding element 123, such as the first direction D1).

However, it should be understood that the extending direction of the light control unit 12A (such as the extending direction of the light-shielding element 123), the color types of the light-emitting regions (such as the first light-emitting region E1, the second light-emitting region E2, the third light-emitting region E3, and the fourth light-emitting region E4), the number of colors of the light-emitting regions, the arrangement of the light-emitting regions, or the relative arrangement relationship between the light-shielding elements 123 and the light-emitting regions, etc., may be changed according to different requirements.

FIG. 4A to FIG. 4E are respectively schematic partial top views of a panel in an electronic device according to some embodiments of the disclosure. To be specific, FIG. 4A to FIG. 4E illustrate four relative arrangement relationships between the light-emitting regions and the transparent region, but it should be understood that other relative arrangement relationships between the light-emitting regions and the transparent region are also within the scope of the disclosure. FIG. 4A to FIG. 4E also show different sub-pixel arrangements.

Figure 4A:
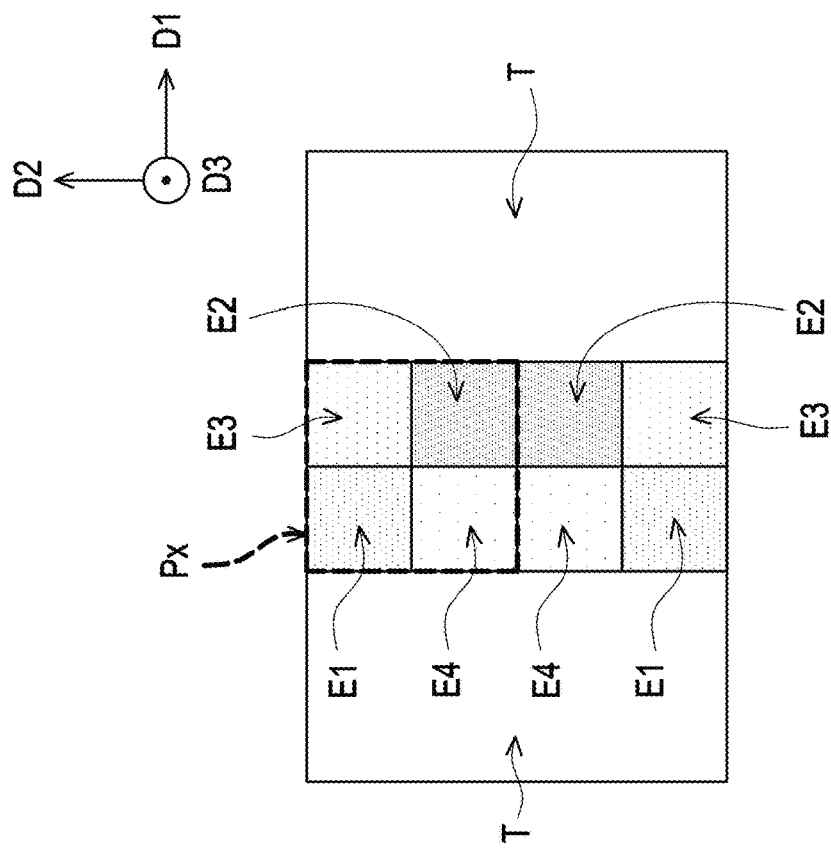
FIG. 4A to FIG. 4E are respectively schematic partial top views of a panel in an electronic device according to some embodiments of the disclosure.

In FIG. 4A, the plurality of first light-emitting regions E1 and the plurality of fourth light-emitting regions E4 are arranged in the second direction D2, and the plurality of second light-emitting regions E2 and the plurality of third light-emitting regions E3 are arranged in the second direction D2, where there are two second light-emitting regions E2 between two adjacent third light-emitting regions E3 in the second directions D2. The first light-emitting region E1 is located between the transparent region T and the third light-emitting region E3 or between the transparent region T and the second light-emitting region E2 in the first direction D1, and the fourth light-emitting region E4 is located between the transparent region T and the second light-emitting region E2 or between the transparent region T and the third light-emitting region E3 in the first direction D1. In the following embodiments, the first light-emitting region E1, the second light-emitting region E2, the third light-emitting region E3, and the fourth light-emitting region E4 are, for example, respectively a red light-emitting region, a green light-emitting region, a blue light-emitting region, and a white light-emitting region, but the disclosure is not limited thereto. According to some embodiments, one light-emitting region (for example, one first light-emitting region E1) may define one sub-pixel. In FIG. 4A, the first light-emitting region E1, the second light-emitting region E2, the third light-emitting region E3, and the fourth light-emitting region E4 may constitute one pixel Px. Two second light-emitting regions E2 (for example, the green light-emitting regions) may be arranged adjacent to each other along the second direction D2, i.e., there is no other light-emitting region between the two second light-emitting regions E2. According to some embodiments, by arranging two green light-emitting regions adjacent to each other, the display quality such as image sharpness is improved.

Figure 4B:
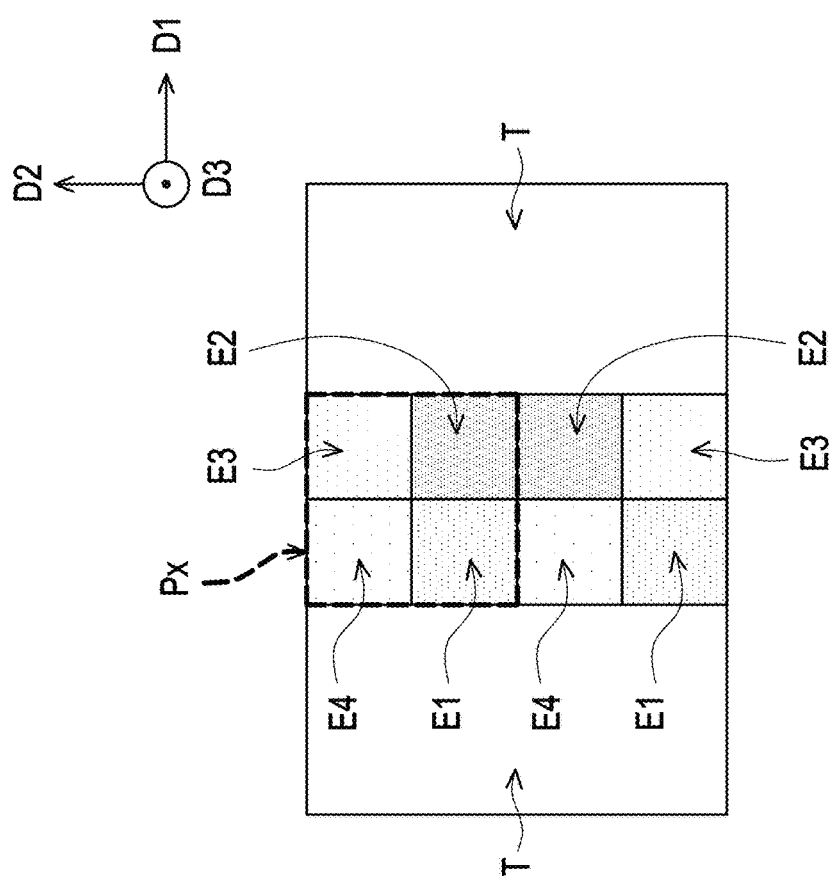

In FIG. 4B, there are two fourth light-emitting regions E4 between two adjacent first light-emitting regions E1 in the second direction D2, where the first light-emitting region E1 is located between the transparent region T and the third light-emitting region E3 in the first direction D1, and the fourth light-emitting region E4 is located between the transparent region T and the second light-emitting region E2 in the first direction D1. In FIG. 4B, the first light-emitting region E1, the second light-emitting region E2, the third light-emitting region E3, and the fourth light-emitting region E4 may constitute a pixel Px. Along the second direction D2, two second light-emitting regions E2 (for example, the green light-emitting regions) may be arranged adjacent to each other and two fourth light-emitting regions E4 (for example, the white light-emitting regions) may be arranged adjacent to each other. According to some embodiments, by arranging the two white light-emitting regions adjacent to each other, the display quality such as image brightness may be improved.

Figure 4D:
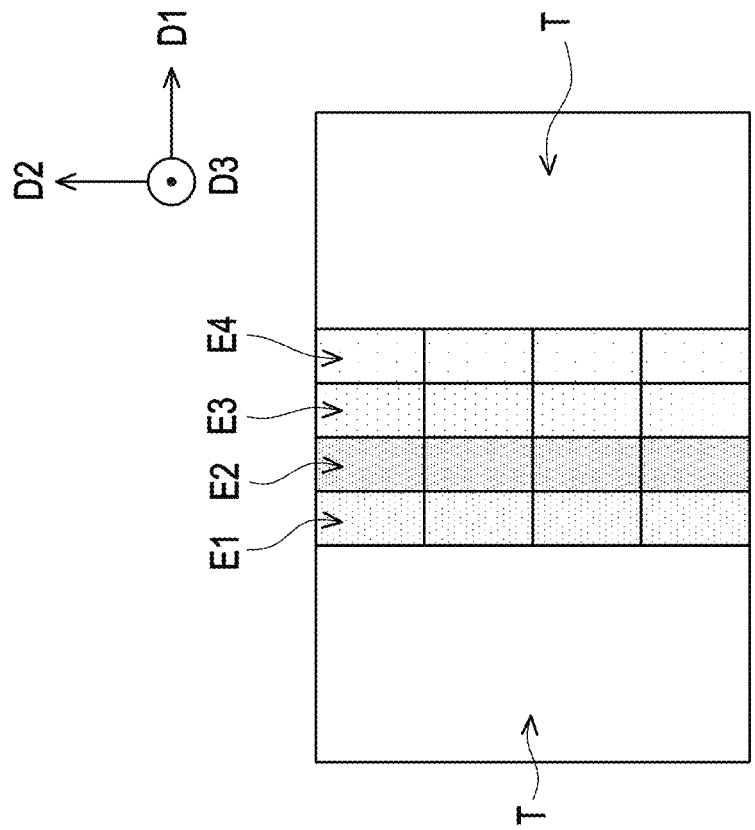
Figure 4C:
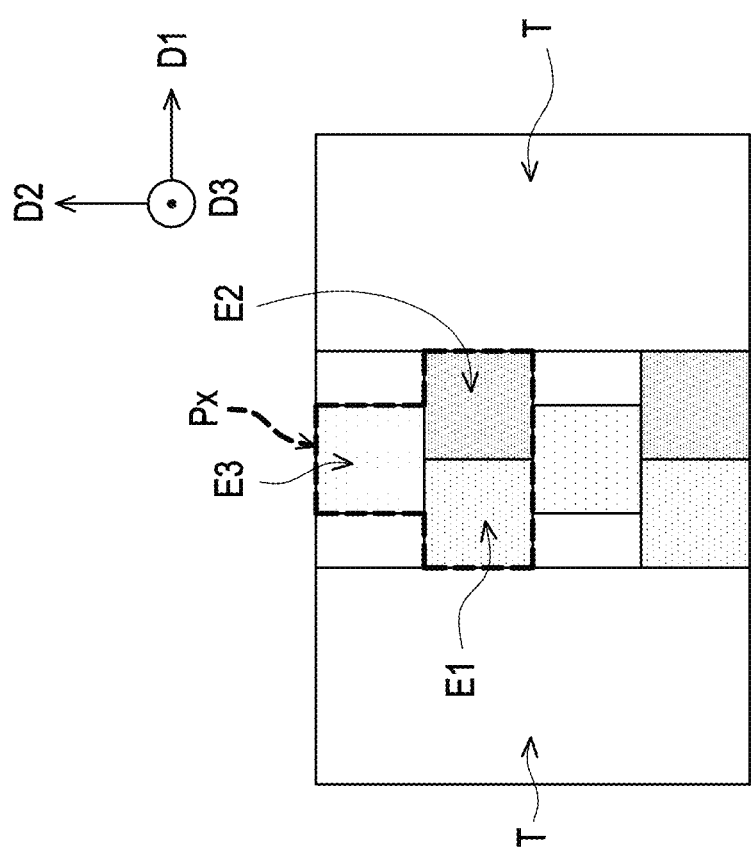

In FIG. 4C, the panel includes the first light-emitting region E1, the second light-emitting region E2, and the third light-emitting region E3, but does not include the fourth light-emitting region E4. The plurality of third light-emitting regions E3 are arranged in the second direction D2, and there are one first light-emitting region E1 and one second light-emitting region E2 between two adjacent third light-emitting regions E3 in the second direction D2, and the one first light-emitting region E1 and the one second light-emitting region E2 are arranged in the first direction D1. In FIG. 4C, the first light-emitting region E1, the second light-emitting region E2, and the third light-emitting region E3 may constitute a pixel Px. The light-emitting regions may be staggered along the second direction D2. For example, the first light-emitting region E1 and the third light-emitting region E3 may be staggered along the second direction D2, i.e., a center of the first light-emitting region E1 and a center of the third light-emitting region E3 are not aligned in the second direction D2. According to some embodiments, the second light-emitting region E2 and the third light-emitting region E3 may be staggered along the second direction D2.

In FIG. 4D, the plurality of light-emitting regions of the same color are arranged in the second direction D2, and the first light-emitting region E1, the second light-emitting region E2, the third light-emitting region E3, and the fourth light-emitting region E4 are arranged in the first direction D1.

Figure 4E:
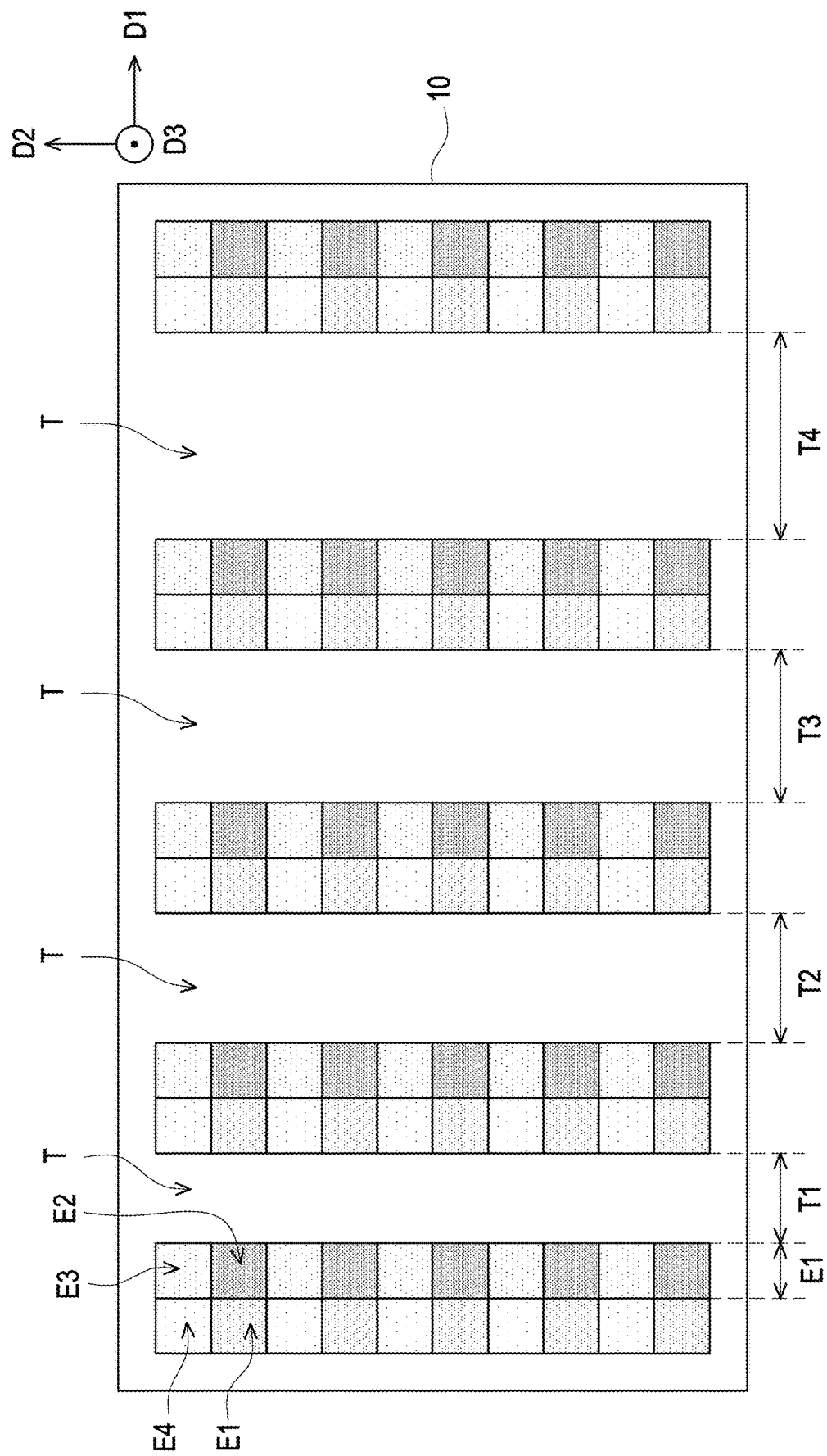

In FIG. 4E, a plurality of transparent regions T are, for example, arranged in the first direction D1 and extend in the second direction D2. In addition, a plurality of widths (such as a width T1, a width T2, a width T3, and a width T4) of the plurality of transparent regions may be, for example, gradually increased or decreased along the first direction D1. Taking left-hand driving as an example, by making the width T4 to be greater than the width T3, the width T3 to be greater than the width T2, and the width T2 to be greater than the width T1, a problem of reduced light transmittance at a large viewing angle is mitigated. Taking right-hand driving as an example, by making the width T1 to be greater than the width T2, the width T2 to be greater than the width T3, and the width T3 to be greater than the width T4, the problem of reduced light transmittance at the large viewing angle is mitigated.

Figure 5B:
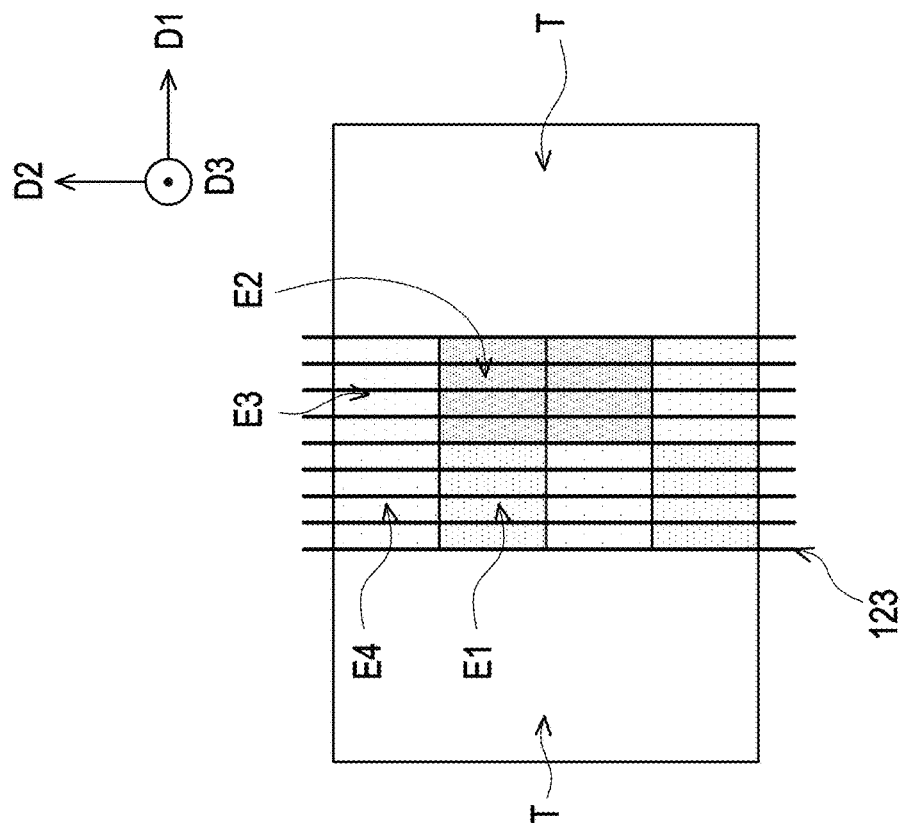
FIG. 5A to FIG. 5C are respectively schematic partial top views of an electronic device according to some embodiments of the disclosure.
Figure 5A:
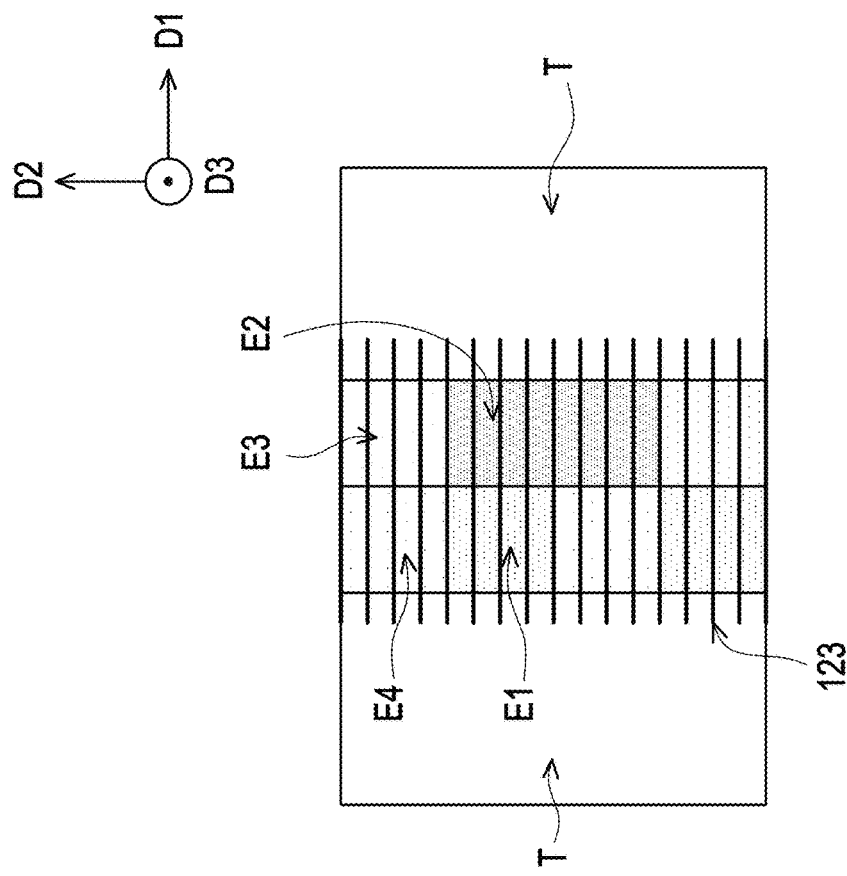
Figure 5C:
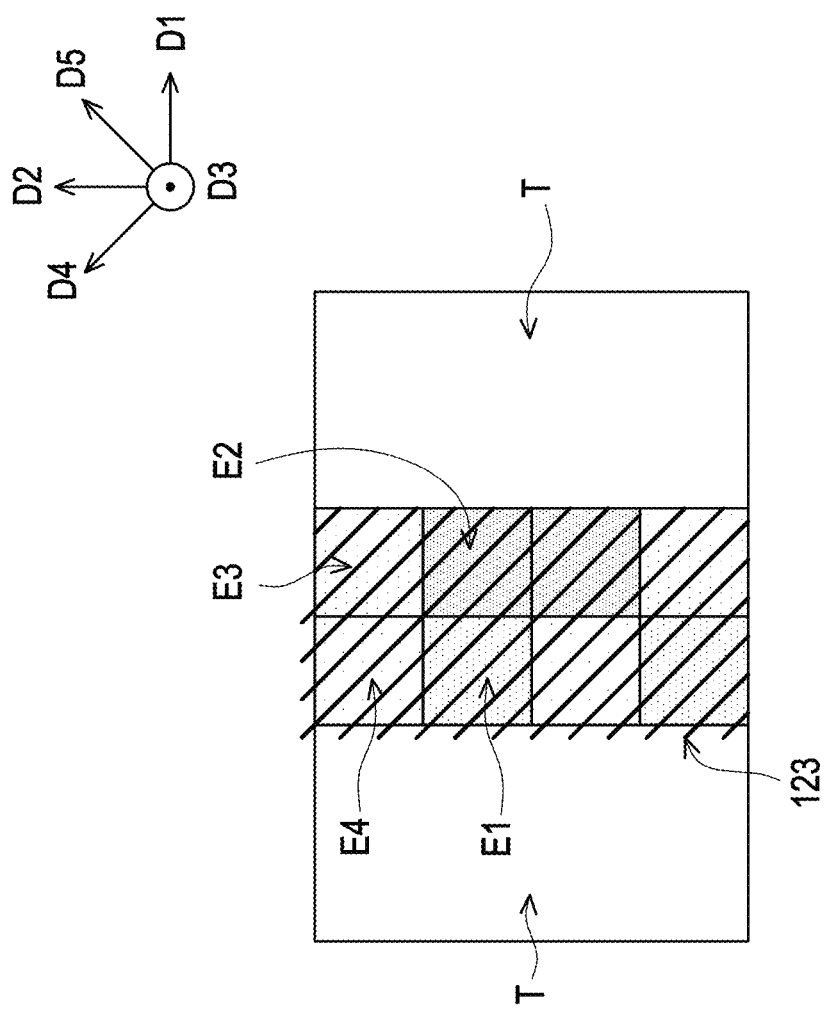

FIG. 5A to FIG. 5C are respectively schematic partial top views of an electronic device according to some embodiments of the disclosure. To be specific, FIG. 5A to FIG. 5C show three relative arrangement relationships of the light-shielding elements, the light-emitting regions and the transparent region, but it should be understood that other relative arrangement relationships of the light-shielding elements, the light-emitting regions and the transparent region may also be within the scope of the disclosure.

In FIG. 5A, the plurality of light-shielding elements 123, for example, extend in the first direction D1 and are arranged in the second direction D2 to limit a divergence angle of light beams in the second direction D2, i.e., to limit the viewing angle of the electronic device in the second direction D2, which helps to mitigate the problem of stray light. In FIG. 5A to FIG. 5C, the pixel arrangements are the same and are the same as that of FIG. 4A, and reference may be made to the related description of FIG. 4A. Along the second direction D2, two second light-emitting regions E2 (for example, the green light-emitting regions) may be arranged adjacent to each other, i.e., there is no other light-emitting region between the two second light-emitting regions E2.

In FIG. 5B, the plurality of light-shielding elements 123, for example, extend in the second direction D2 and are arranged in the first direction D1 to limit the divergence angle of light beams in the first direction D1, i.e., to limit the viewing angle of the electronic device in the first direction D1, which helps to mitigate a problem of overlap between left and right eye images (for example, an application of stereoscopic display).

In FIG. 5C, the plurality of light-shielding elements 123, for example, extend in a fourth direction D4 and are arranged in a fifth direction D5 to limit the divergence angle of light beams in the fifth direction D5, i.e., to limit the viewing angle of the electronic device in the fifth direction D5 (for example, applied to an edge of the panel).

The fourth direction D4 and the fifth direction D5 are intersected and are both perpendicular to the third direction D3. For example, the fourth direction D4 and the fifth direction D5 may be perpendicular to each other, but the disclosure is not limited thereto. The fourth direction D4 is inclined with respect to the first direction D1 and the second direction D2, and the fifth direction D5 is inclined with respect to the first direction D1 and the second direction D2. In other words, the fourth direction D4 is neither parallel nor perpendicular to the first direction D1 and the second direction D2, and the fifth direction D5 is neither parallel nor perpendicular to the first direction D1 and the second direction D2.

FIG. 6 to FIG. 9 are respectively schematic partial top views of an electronic device according to some other embodiments of the disclosure. To be specific, FIG. 6 to FIG. 9 show four relative arrangement relationships of the light-shielding elements and the light-emitting regions, but it should be understood that other relative arrangement relationships of the light-shielding elements and the light-emitting regions are also within the scope of the disclosure.

Figure 6:
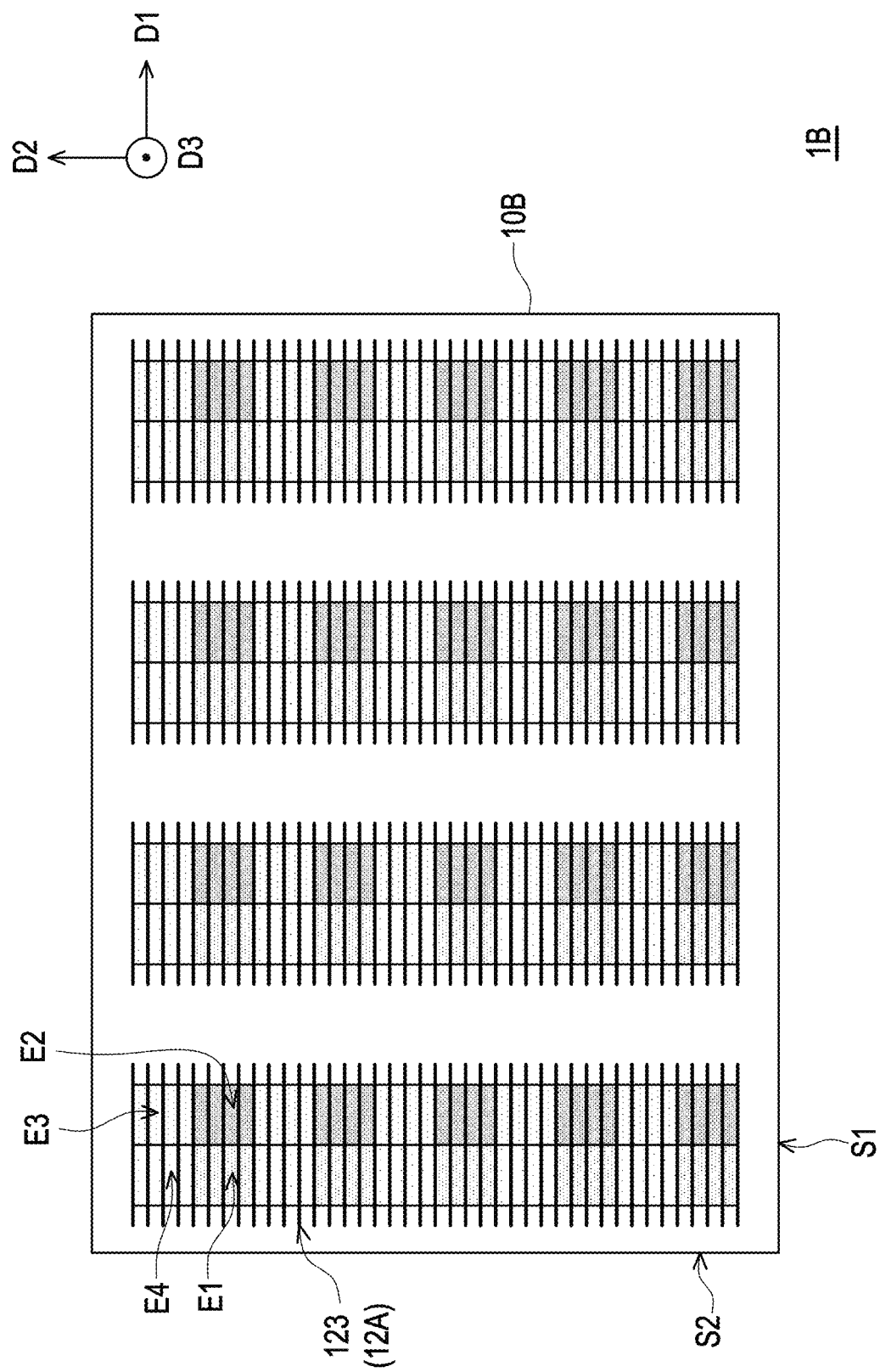
FIG. 6 to FIG. 9 are respectively schematic partial top views of an electronic device according to some other embodiments of the disclosure.

In an electronic device 1B of FIG. 6, a panel 10B includes the plurality of first light-emitting regions E1, the plurality of second light-emitting regions E2, the plurality of third light-emitting regions E3, and the plurality of fourth light-emitting regions E4. The plurality of first light-emitting regions E1 and the plurality of fourth light-emitting regions E4 are alternately arranged in the second direction D2, and the plurality of second light-emitting regions E2 and the plurality of third light-emitting regions E3 are alternately arranged in the second direction D2.

The first side S1 of the electronic device 1B is substantially parallel to the extending direction of the light-shielding element 123 in the light control unit 12A. For example, the extending direction of the light-shielding element 123 is parallel to the first direction D1, and the light-shielding element 123 is, for example, overlapped with one first light-emitting region E1 and one second light-emitting region E2 or overlapped with one third light-emitting region E3 and one fourth light-emitting region E4 in the third direction D3.

Figure 7:
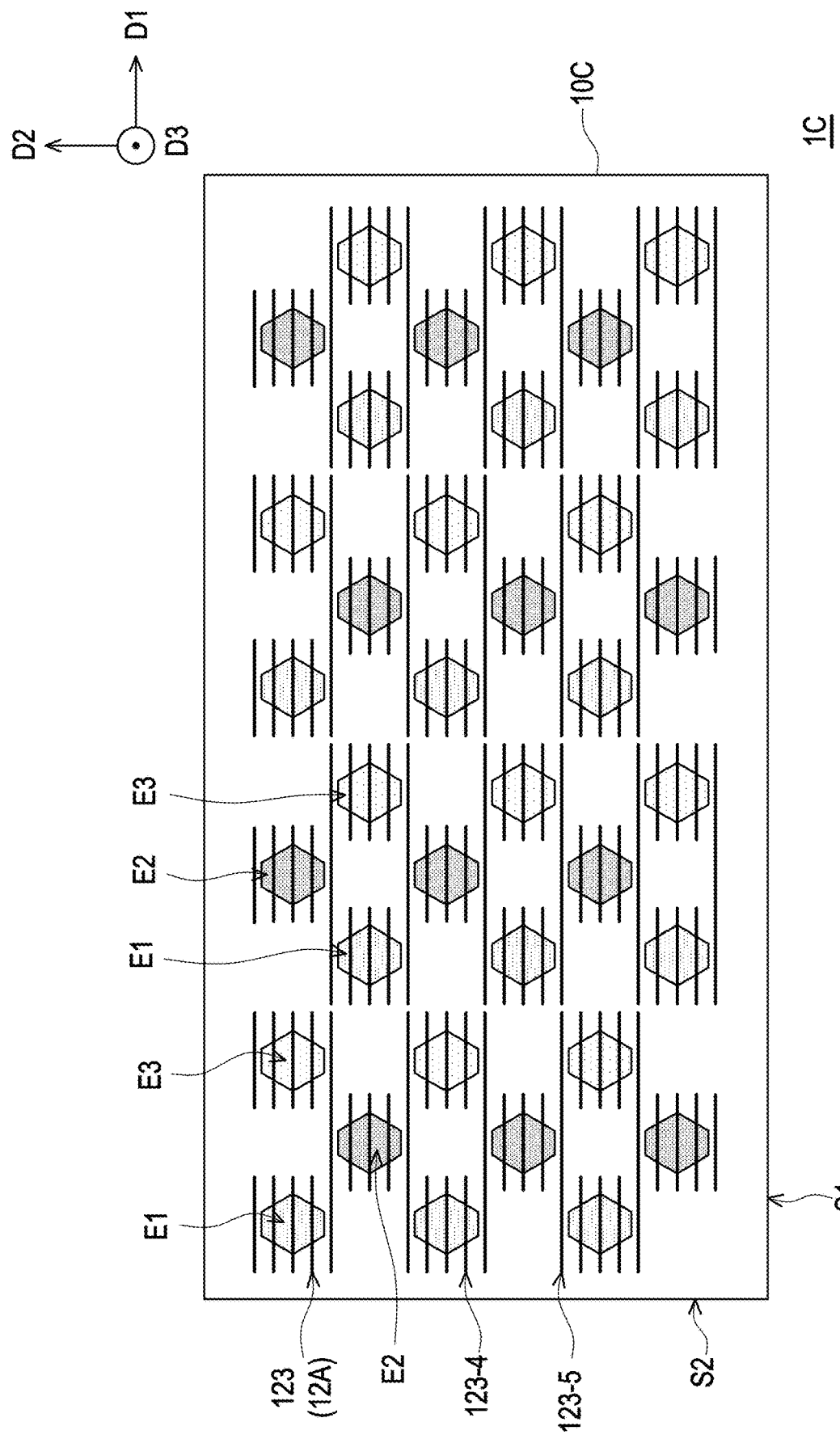

In an electronic device 1C of FIG. 7, a panel 10C includes the plurality of first light-emitting regions E1, the plurality of second light-emitting regions E2, and the plurality of third light-emitting regions, and the light-emitting regions are arranged in interleaving in the first direction D1 and the second direction D2. In addition, the plurality of first light-emitting regions E1, the plurality of second light-emitting regions E2, and the plurality of third light-emitting regions are alternately arranged in the first direction D1, and the plurality of light-emitting regions of the same color are arranged in the second direction D2.

The first side S1 of the electronic device 1C is substantially parallel to the extending direction of the light-shielding element 123 in the light control unit 12A. For example, the extending direction of the light-shielding element 123 is, for example, parallel to the first direction D1, where at least one light-shielding element (such as a light-shielding element 123-4) of the plurality of light-shielding elements 123 is overlapped with at least one of the first light-emitting region E1, the second light-emitting region E2, and the third light-emitting region E3 in the third direction D3, and at least one light-shielding element (such as a light-shielding element 123-5) in the plurality of light-shielding elements 123 is not overlapped with any light-emitting region in the third direction D3.

Figure 8:
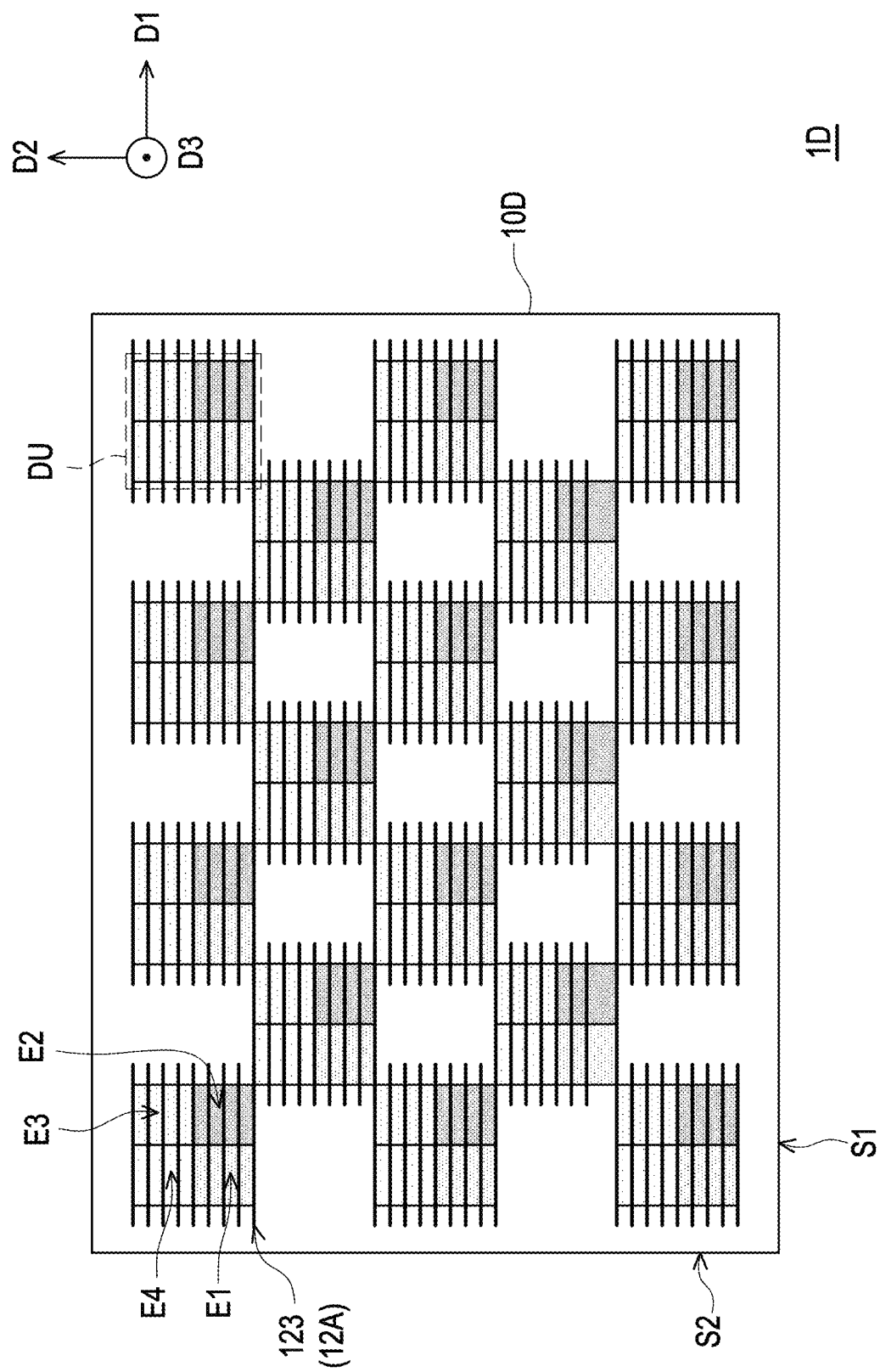

In an electronic device 1D of FIG. 8, a panel 10D includes a plurality of display units DU. Each display unit DU may be, for example, a pixel including one first light-emitting region E1, one second light-emitting region E2, one third light-emitting region E3, and one fourth light-emitting region E4, but the disclosure is not limited thereto. The display units DU are arranged in interleaving in the first direction D1 and the second direction D2.

The first side S1 of the electronic device 1D is substantially parallel to the extending direction of the light-shielding element 123 in the light control unit 12A. For example, the extending direction of the light-shielding element 123 is parallel to the first direction D1, and the light-shielding element 123 may be, for example, overlapped with one first light-emitting region E1 and one second light-emitting region E2, or overlapped with one third light-emitting region E3 and one fourth light-emitting region E4 in the third direction D3.

Figure 9:
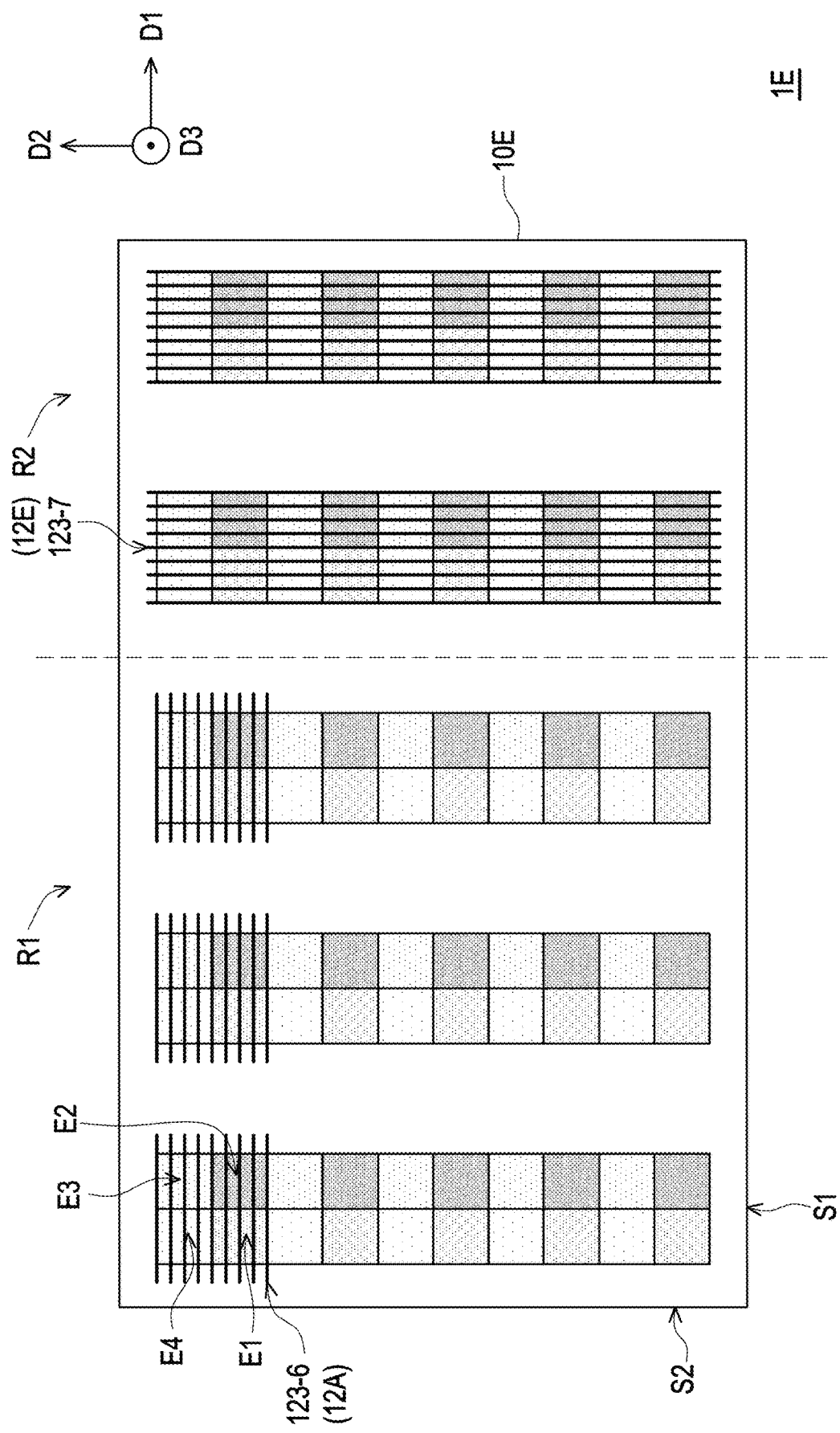

In an electronic device 1E of FIG. 9, the panel 10E may include a first region R1 and a second region R2. The panel 10E is provided with a light control unit 12A and a light control unit 12E. The light control unit 12A is disposed corresponding to the first region R1 of the panel 10E, and the light control unit 12E is disposed corresponding to the second region R2 of the panel 10E. The first side S1 of the electronic device 1E is substantially parallel to the extending direction of the light control unit 12A. For example, the light control unit 12A includes a plurality of light-shielding elements 123-6. The extending direction of the light-shielding element 123-6 is, for example, parallel to the first direction D1, and the light-shielding element 123-6 is, for example, overlapped with the first light-emitting region E1 and the second light-emitting region E2 or overlapped with the third light-emitting region E3 and the fourth light-emitting region E4 in the third direction D3. The second side S2 of the electronic device 1E is substantially parallel to the extending direction (the second direction D2) of the light control unit 12E. For example, the light control unit 12E includes a plurality of light-shielding elements 123-7. The extending direction of the light-shielding element 123-7 is, for example, parallel to the second direction D2, and in the third direction D3, the light-shielding element 123-7 is, for example, overlapped with the plurality of first light-emitting regions E1 and the plurality of fourth light-emitting regions E1 arranged in the second direction D2 or overlapped with the plurality of second light-emitting regions E2 and the plurality of third light-emitting regions E3 arranged in the second direction D2.

As shown in FIG. 9, the light control unit 12A disposed corresponding to the first region R1 may be used to limit a divergence angle of light beams in the second direction D2, and the light control unit 12E disposed corresponding to the second region R2 may be used to limit the divergence angle of the light beams in the first direction D1. When the electronic device 1E is used in a vehicle, for example, when it is used as an instrument panel, the first region R1 may correspond to a region where the driver is located, and the second region R2 may correspond to a region where a co-pilot is located. The light control unit 12A disposed corresponding to the first region R1 may suppress the large-angle light beams output from the panel 10E (for example, to limit the light beams in the second direction D2). In this way, the large-angle light beams (relative to the third direction D3) may be reduced from being reflected by the windshield, so as to reduce the stray light viewed by the driver and improve the image quality viewed by the driver. On the other hand, the light control unit 12E disposed corresponding to the second region R2 may limit the divergence angle of the light beams in the first direction D1, i.e., to suppress the light beams in the first direction D1. In this way, the light emitted by the second region R2 (in front of the co-pilot) may be reduced from being viewed by the driver, thereby reducing the impact on the driver's attention.

It should be understood that, in any embodiment of the disclosure, the electronic device may include a single light control unit to limit the divergence angle of the light beams in a single direction, or the electronic device may include multiple types (two types as shown in FIG. 9 or more types) of light control units to limit the divergence angle of the light beams in different directions. For example, different types of light control units may be arranged in different regions of the panel to achieve regional light control.

Figure 10:
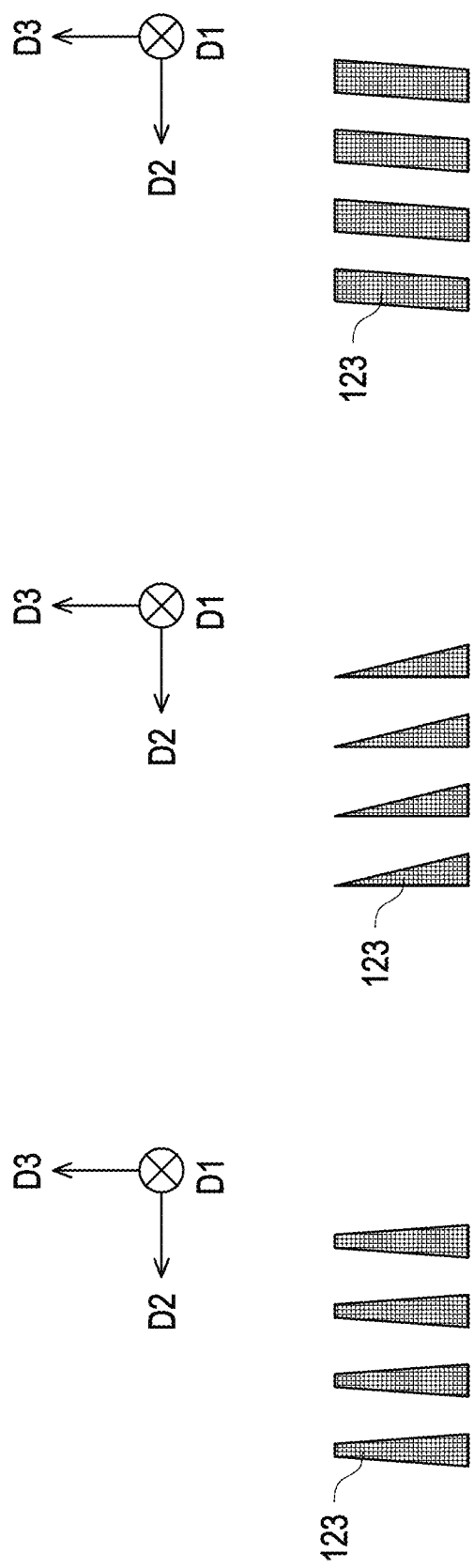
FIG. 10A to FIG. 10C are respectively schematic cross-sectional views of light-shielding elements in an electronic device according to some embodiments of the disclosure.

FIG. 10A to FIG. 10C are respectively schematic cross-sectional views of light-shielding elements in an electronic device according to some embodiments of the disclosure. Referring to the aforementioned embodiments, in any embodiment where the light control unit includes a plurality of light-shielding elements (such as light-shielding elements 123, a light-shielding element 123-1, a light-shielding element 123-2, a light-shielding element 123-3, a light-shielding element 123-4, a light-shielding element 123-5, a light-shielding element 123-6 and a light-shielding element 123-7), a cross-sectional shape of the light-shielding element may be changed as required. For example, the cross-sectional shape of the light-shielding element may be a rectangle (such as a square or a rectangle as shown in FIG. 3B), a trapezoid (as shown in FIG. 10A), a triangle (as shown in FIG. 10B), or a parallelogram (as shown in FIG. 10C), but the disclosure is not limited thereto.

Figure 11:
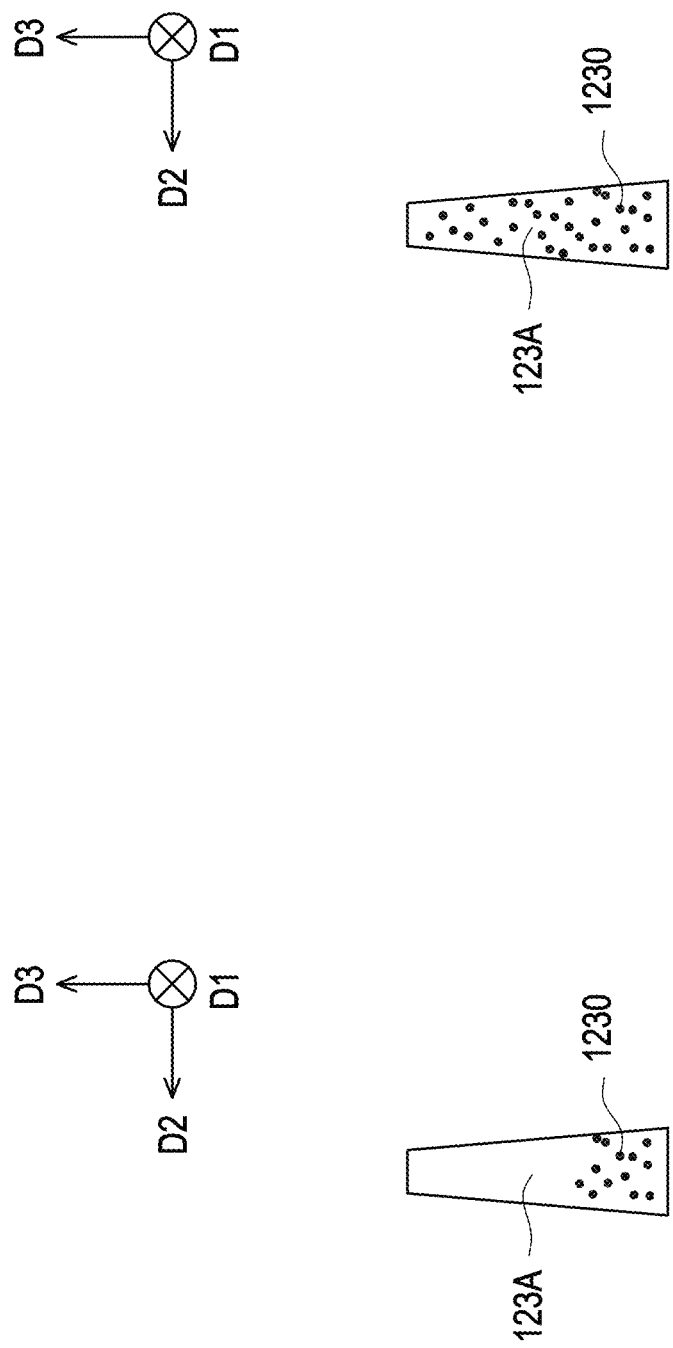
FIG. 11A and FIG. 11B are respectively schematic cross-sectional views of a light-shielding element of an electronic device in non-activation and in activation according to an embodiment of the disclosure.

FIG. 11A and FIG. 11B are respectively schematic cross-sectional views of a light-shielding element of an electronic device in non-activation and in activation according to an embodiment of the disclosure. In some embodiments, as shown in FIG. 11A and FIG. 11B, the light-shielding element 123A is, for example, electrically switchable. To be specific, the light-shielding element 123A may include conductive light-shielding particles 1230. When the light-shielding element 123A is in non-activation, the light-shielding particles 1230 may be located at a bottom of the light-shielding element 123A, so that the light-shielding element 123A is substantially light-transmissive without a light control effect (for example, to limit a divergence angle of light beams). On the other hand, when the light-shielding element 123A is in activation, the light-shielding particles 1230 may be dispersed in the light-shielding element 123A due to an effect of an electric field, and the light-shielding element 123A substantially shields light and has the light control effect.

Figure 12:
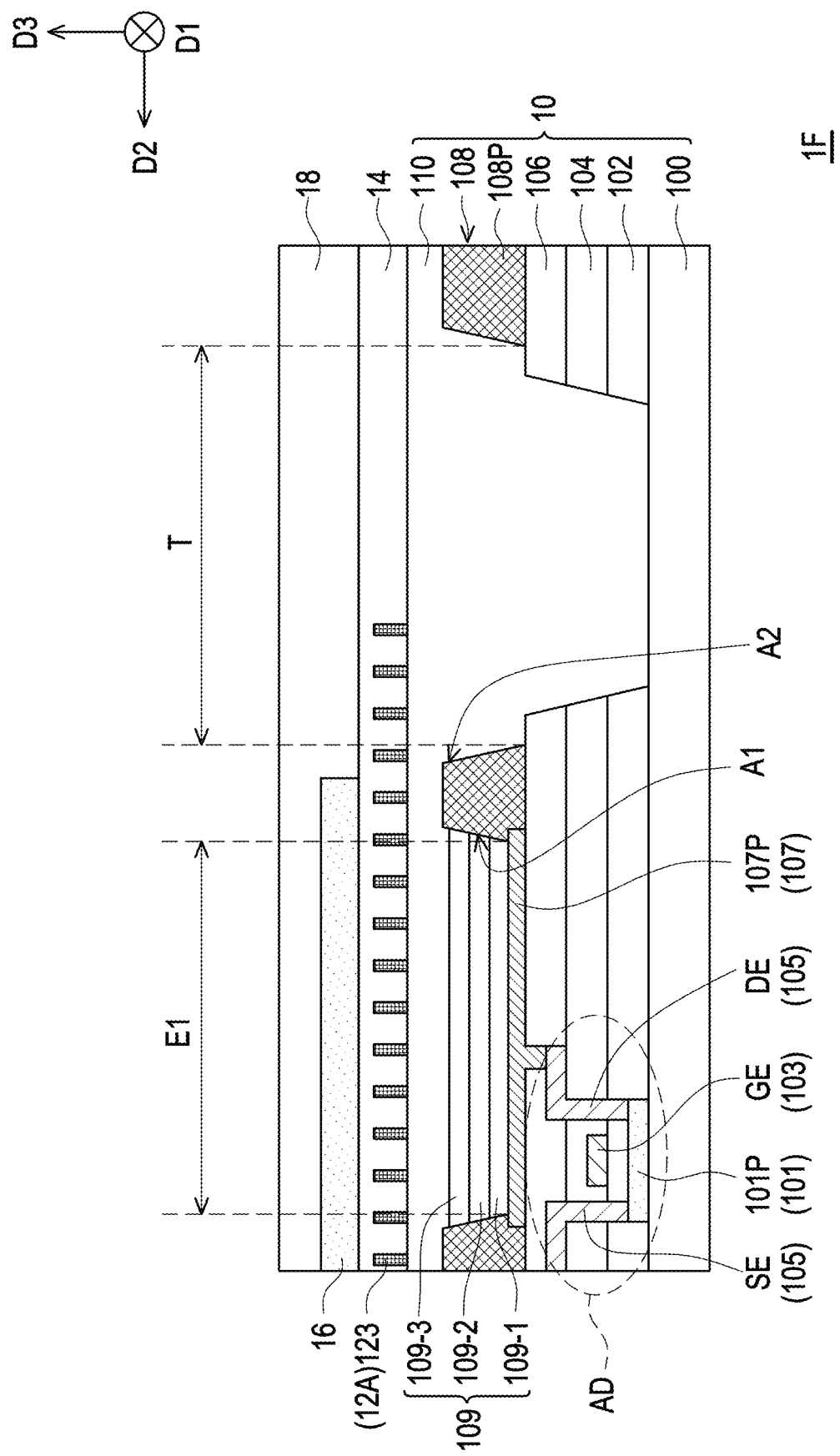
FIG. 12 to FIG. 16 are respectively schematic partial cross-sectional views of electronic devices according to still some other embodiments of the disclosure.

FIG. 12 to FIG. 16 are respectively schematic partial cross-sectional views of electronic devices according to still some other embodiments of the disclosure. Referring to FIG. 12, main differences between an electronic device 1F and the electronic device 1A of FIG. 3B are described as follows.

The electronic device 1F further includes a light conversion layer 16 and a passivation layer 18. The light conversion layer 16 is disposed on the cover layer 14 and is overlapped with the light-emitting regions (such as the first light-emitting region E1) in the third direction D3. The light conversion layer 16 may be used to increase a color saturation of the electronic device 1F. For example, a material of the light conversion layer 16 may include a wavelength conversion material and/or a light filter material, such as fluorescence, phosphor, quantum dots (QD), other suitable materials, or a combination of the above materials, but the disclosure is not limited thereto. The passivation layer 18 is disposed on the cover layer 14 and covers the light conversion layer 16. A material of the passivation layer 18 may include a transparent material, a water and oxygen blocking material, other suitable materials, or a combination of the above materials, but the disclosure is not limited thereto. For example, the material of the protective layer 18 includes epoxy, acrylic-based resin, silicone, polyimide polymer, or a combination thereof, but the disclosure is not limited thereto.

In some embodiments, the light conversion layer 16 may be formed on the cover layer 14. In some other embodiments, although not shown, the light conversion layer 16 and the passivation layer 18 may be formed on another substrate (not shown) and then attached to the cover layer 14, i.e., there is an adhesive layer (not shown) between the light conversion layer 16 and the cover layer 14.

Figure 13:
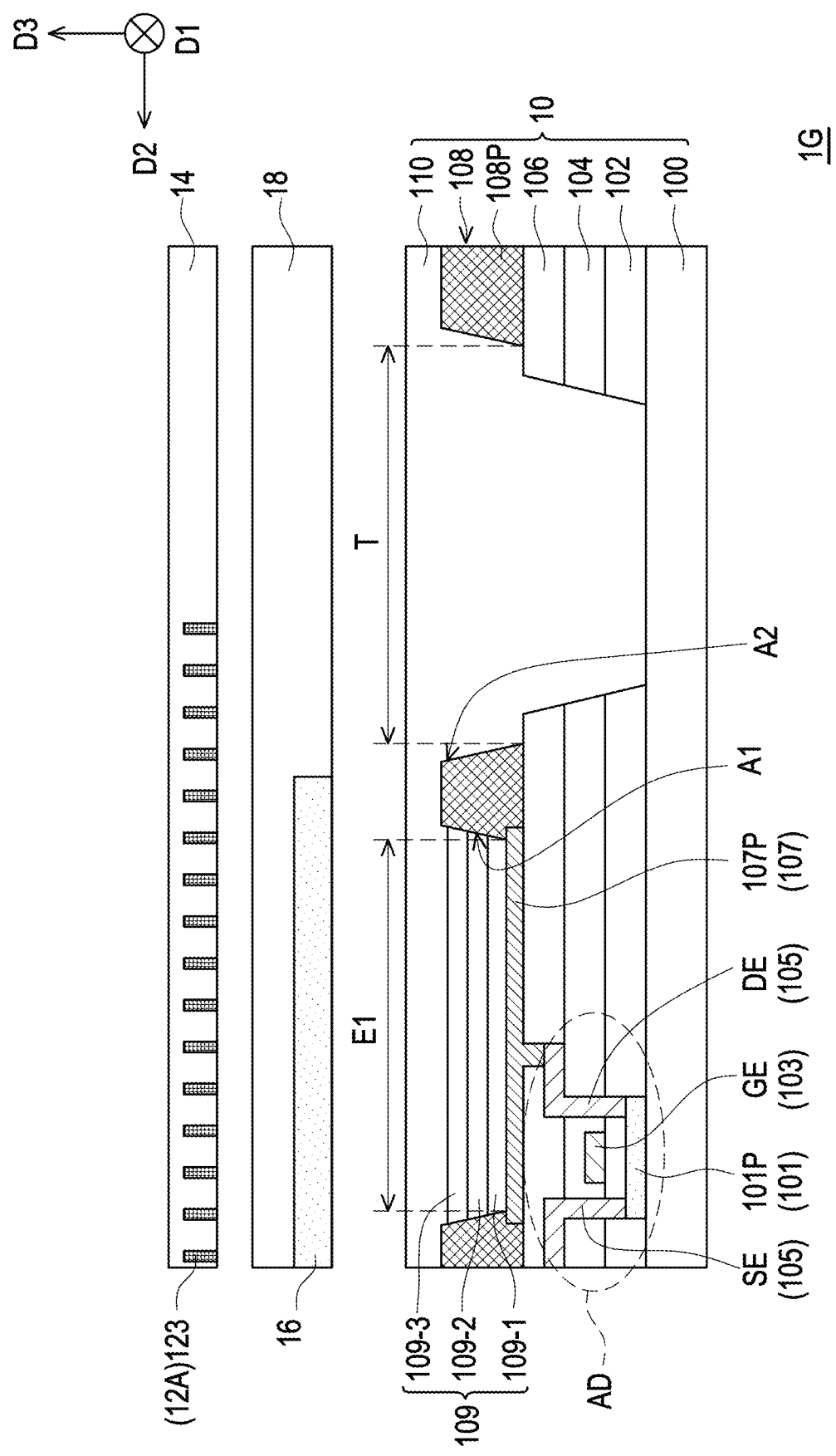

Referring to FIG. 13, main differences between an electronic device 1G and the electronic device 1F of FIG. 12 are described as follows.

In the electronic device 1G, the light conversion layer 16 and the passivation layer 18 are first formed on a substrate (not shown), and are then attached to the filling layer 110, i.e., there is an adhesive layer (not shown) between the light conversion layer 16 and the filling layer 110. In addition, the light control unit 12A and the cover layer 14 are first formed on another substrate (not shown), and are then attached to the passivation layer 18, i.e., there is an adhesive layer (not shown) between the cover layer 14 and the passivation layer 18. In some other embodiments, although not shown, the light control unit 12A and the cover layer 14 formed on the other substrate (not shown) may be first attached to the filling layer 110, and then the light conversion layer 16 and the passivation layer 18 formed on the substrate (not shown) are attached to the cover layer 14.

Figure 14:
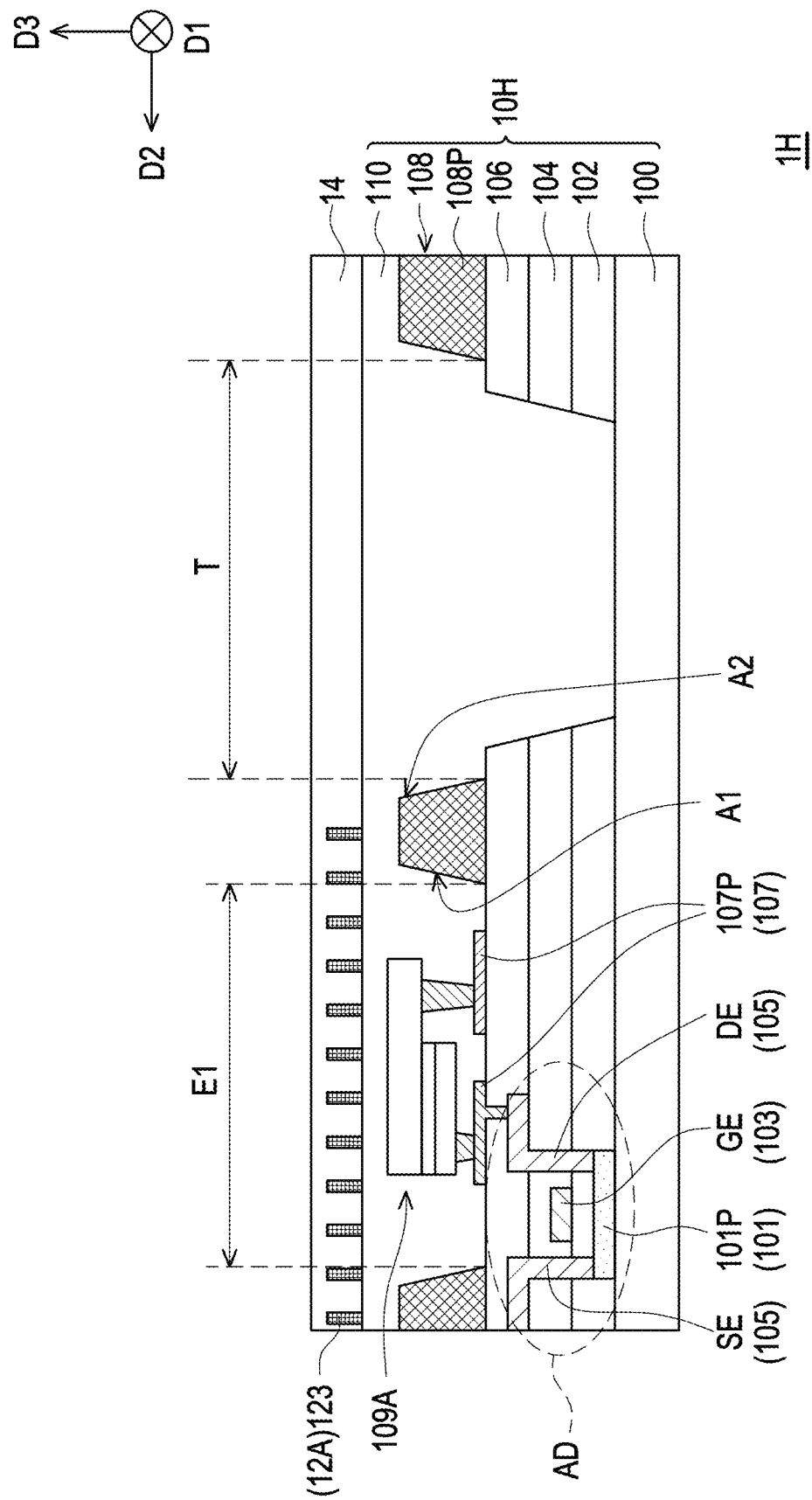

Referring to FIG. 14, main differences between an electronic device 1H and the electronic device 1A of FIG. 3B are described as follows. In the electronic device 1H, a panel is, for example, a micro LED display panel, and a light-emitting element 109A is, for example, a micro LED.

Figure 15:
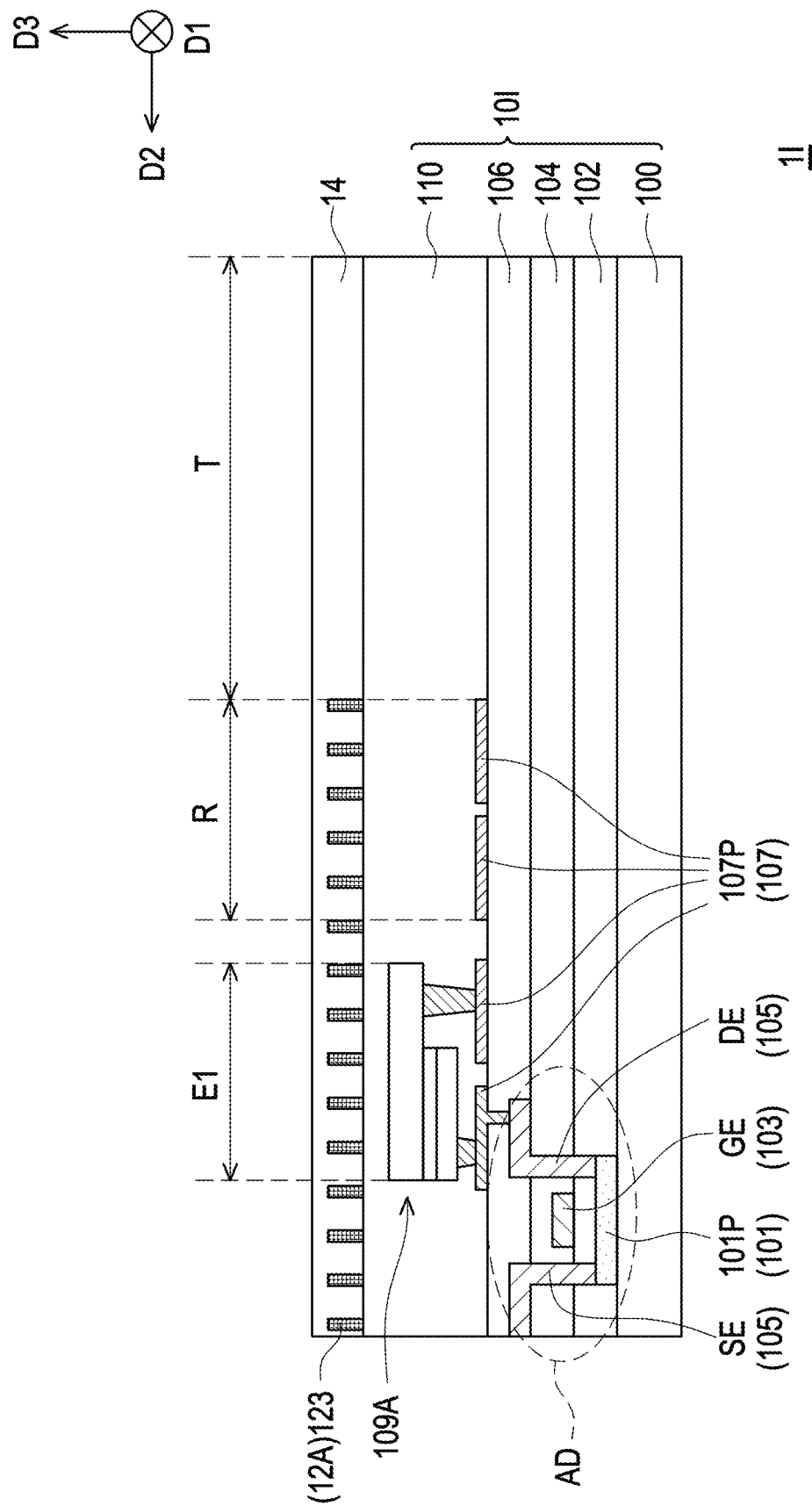

Referring to FIG. 15, main differences between an electronic device 1I and the electronic device 1H of FIG. 14 are described as follows. In the electronic device 1I, a panel 10I may not include the pixel definition layer 108 of FIG. 14. Under such structure, a light-emitting surface of the light-emitting element 109A (such as a micro LED) is used as a range of a light-emitting region (such as the first light-emitting region E1). In addition, the panel 10I may further include a repair region R. A part of the electrode patterns 107P of the third conductive layer 107 may be located in the repaired region R. In this way, when the light-emitting element 109A cannot be operated, another light-emitting element 109A may be bonded to the electrode patterns 107P in the repaired region R.

Figure 16:
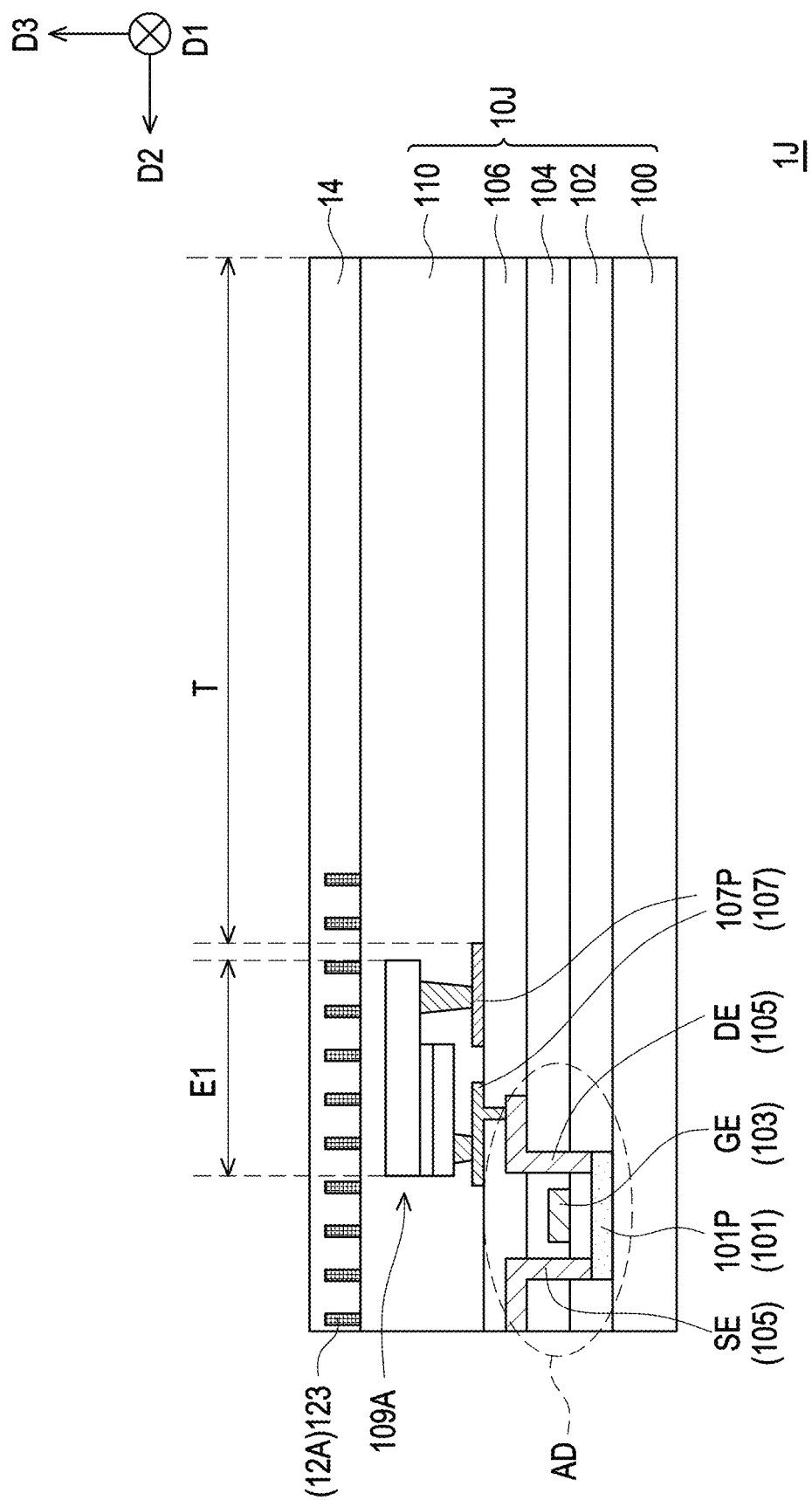

Referring to FIG. 16, main differences between an electronic device 1J and the electronic device 1I of FIG. 15 are described as follows. In the electronic device 1J, a panel 10J may not include the repair region R.

Although only a single light-emitting element 109A is shown in the embodiments of FIG. 14 to FIG. 16, it should be understood that the number of the light-emitting elements 109A in the electronic device may be plural. In addition, in some embodiments, although not shown, the light-emitting element 109A may be an integrated LED (such as red, green and blue LEDs packaged together), but the disclosure is not limited thereto. In addition, the light control unit 12A in the embodiments of FIG. 14 to FIG. 16 may also be replaced with the light control unit 12 shown in FIG. 1B, and the light conversion layer 16 and/or the passivation layer 18 may be added according to different requirements.

In summary, in the embodiments of the disclosure, the electronic device includes a panel and a light control unit, the panel includes a first light-emitting region and a transparent region, and the light control unit is overlapped with the first light-emitting region. According to some embodiments, the light control unit may suppress the light emitted from the panel in a specific direction, which may improve the quality of the image viewed by the viewer. According to some embodiments, the electronic device may be used in a vehicle, and the light control unit may suppress the light emitted from the panel in a specific direction. In this way, the light in the specific direction may be reduced from being reflected by the windshield, so as to reduce the stray light viewed by the driver to improve the quality of the image viewed by the driver, and mitigate the impact on the driver's attention.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

Although the embodiments and advantages of the embodiments of the disclosure have been disclosed as above, it should be understood that any person skilled in the art, without departing from the spirit and scope of the disclosure, may make changes, substitutions and modifications, and the features of the embodiments may be arbitrarily mixed and replaced to form other new embodiments. Moreover, a protection scope of the disclosure is not limited to the processes, machines, manufacturing, material composition, devices, methods, and steps of the specific embodiments described in the specification, and any person skilled in the art should understand the processes, machines, manufacturing, material composition, devices, methods, and steps used currently or developed in the future from the content disclosed in the disclosure, as long as the substantially same functions may be implemented or the substantially same results may be obtained in the embodiments described herein. Therefore, the protection scope of the disclosure includes the above processes, machines, manufacturing, material composition, devices, methods, and steps. In addition, each claim constitutes an individual embodiment, and the protection scope of the disclosure also includes a combination of each claim and the embodiment. The protection scope of the disclosure is defined by the appended claims.

What is claimed is:

1. An electronic device, comprising:
   a substrate;
   a first display unit disposed on the substrate, the first display unit comprising a first light-emitting element and a second light-emitting element disposed adjacent to the first light-emitting element along a first direction, wherein the first light-emitting element and the second light-emitting element emits different colors;
   a second display unit disposed on the substrate, the second display unit comprising a third light-emitting element and a fourth light-emitting element;
   a third display unit disposed on the substrate, the third display unit comprising a fifth light-emitting element, wherein the third light-emitting element and the fourth light-emitting element are disposed adjacently along the first direction, the third light-emitting element and the fifth light-emitting element are disposed adjacently along a second direction perpendicular to the first direction,
   wherein the third light-emitting element and the fourth light-emitting element emits different colors, the second light-emitting element of the first display unit is disposed adjacent to the third light-emitting element of the second display unit along the first direction, and the second light-emitting element and the third light-emitting element are spaced apart by a space;
   a transparent portion, wherein in the top view, the transparent portion is disposed between the second light-emitting element of the first display unit and the third light-emitting element of the second display unit, and the transparent portion is overlapped with the space between the second light-emitting element and the third light-emitting element; and
   a light-shielding layer, wherein in the top view, a first part of the light-shielding layer is overlapped with the first display unit, a second part of the light-shielding layer is overlapped with the second display unit, wherein a third part of the light-shielding layer is overlapped with at least a portion of the transparent portion, and the first part of the light-shielding layer is connected to and extends to the third part of the light-shielding layer along the first direction,
   wherein a length of the third part of the light-shielding layer along the first direction is greater than a width of the third part of the light-shielding layer along the second direction, and
   wherein a fourth part of the light-shielding layer is overlapped with the third display unit, the second part of the light-shielding layer is connected to and extends to the fourth part of the light-shielding layer along the second direction.

2. The electronic device as claimed in claim 1, wherein the light-emitting element is an organic light-emitting element.

3. The electronic device as claimed in claim 1, wherein the first light-emitting element and the second light-emitting element of the first display unit emit colors of red, green, or blue.

4. The electronic device as claimed in claim 1, wherein the third light-emitting element and the fourth light-emitting element of the second display unit emit colors of red, green, or blue.

5. The electronic device as claimed in claim 1, further comprising:
   a pixel definition layer comprising a first opening, wherein the first light-emitting element is disposed in the first opening.

6. The electronic device as claimed in claim 5, wherein the pixel definition layer further comprises a second opening, and the transparent portion is disposed corresponding to the second opening.

7. The electronic device as claimed in claim 6, wherein the pixel definition layer is patterned to include the first opening, the second opening and a plurality of pixel definition patterns, and
   wherein the second light-emitting element and the transparent portion are separated by a pixel definition pattern of the plurality of pixel definition patterns.

8. The electronic device as claimed in claim 1, further comprising:
   a pixel definition layer comprising a second opening, and the transparent portion is disposed corresponding to the second opening.

9. The electronic device as claimed in claim 1, wherein the first light-emitting element and the third light-emitting element emit a first color.

10. The electronic device as claimed in claim 9, wherein the second light-emitting element and the fourth light-emitting element emit a second color different from the first color.

11. The electronic device as claimed in claim 1, further comprising:
   a light conversion layer, overlapping at least a portion of the light-shielding layer.

12. The electronic device as claimed in claim 1, further comprising:
   a first active device and a second active device disposed on the substrate;
   a first electrode pattern disposed on and electrically connected to the first active device, wherein the second light-emitting element of the first display unit is disposed on the first electrode pattern; and
   a second electrode pattern disposed on and electrically connected to the second active device, wherein the third light-emitting element of the second display unit is disposed on the second electrode pattern.

* * * * *